United States Patent
Koo

(10) Patent No.: US 9,275,707 B2
(45) Date of Patent: Mar. 1, 2016

(54) DRIVER AND MEMORY CONTROLLER HAVING THE SAME

(71) Applicant: Samsung Electronics Co., Ltd., Suwon-si (KR)

(72) Inventor: Kyung-Hoi Koo, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/134,620

(22) Filed: Dec. 19, 2013

(65) Prior Publication Data

US 2014/0313846 A1    Oct. 23, 2014

(30) Foreign Application Priority Data

Apr. 22, 2013   (KR) .................. 10-2013-0044440

(51) Int. Cl.
*G11C 8/08* (2006.01)
*G11C 8/06* (2006.01)
*G11C 5/14* (2006.01)

(52) U.S. Cl.
CPC ... *G11C 8/06* (2013.01); *G11C 5/14* (2013.01)

(58) Field of Classification Search
CPC ................................ G11C 8/08; G11C 5/14
USPC ............................. 365/230.06, 226
See application file for complete search history.

(56) References Cited

U.S. PATENT DOCUMENTS

| | | | | |
|---|---|---|---|---|
| 5,959,481 | A * | 9/1999 | Donnelly et al. | 327/170 |
| 6,157,582 | A * | 12/2000 | Rezeanu | 365/200 |
| 7,007,175 | B2 * | 2/2006 | Chang et al. | 713/300 |
| 7,729,168 | B2 * | 6/2010 | Zumkehr et al. | 365/185.09 |
| 7,834,655 | B1 * | 11/2010 | Ou | 326/30 |
| 7,898,878 | B2 | 3/2011 | Nguyen et al. | |
| 7,924,863 | B2 * | 4/2011 | Baruch | 370/421 |
| 7,969,233 | B2 * | 6/2011 | Matano | 327/536 |
| 8,004,314 | B2 | 8/2011 | Kim | |
| 8,023,358 | B2 * | 9/2011 | Kim et al. | 365/233.18 |
| 8,035,413 | B2 | 10/2011 | Millar | |
| 8,149,017 | B2 | 4/2012 | Knierim | |
| 8,324,927 | B2 | 12/2012 | Bhakta et al. | |
| 8,428,196 | B2 * | 4/2013 | Stojanovic et al. | 375/340 |
| 8,495,310 | B2 * | 7/2013 | Gregorius et al. | 711/151 |
| 8,649,210 | B2 * | 2/2014 | Lin et al. | 365/154 |
| 8,799,553 | B2 * | 8/2014 | Hendry et al. | 711/5 |
| 2006/0092742 | A1 * | 5/2006 | Paillet et al. | 365/225.7 |

OTHER PUBLICATIONS

Samsung, JEDEC, Global Standards for the Microelectronics Industry, Versatile IO Circuit Schemes for LPDDR4/LPDDR3 Combo, May 1, 2013, pp. 1-10.

* cited by examiner

*Primary Examiner* — Michael Tran
(74) *Attorney, Agent, or Firm* — Onello & Mello LLP

(57) ABSTRACT

A memory controller includes a bus driver that allows the controller to support both a semiconductor memory device supporting a low power double data rate 3 (LPDDR3) transmission method and a semiconductor memory device supporting a low power double data rate 4 (LPDDR4) transmission method.

19 Claims, 33 Drawing Sheets

| Data | PG | /PG | NG | PD |
|------|----|-----|----|----|
| 1    | L  | H   | L  | H  |
| 0    | H  | L   | H  | L  |

| Data | PG | NG | PD |
|------|----|----|----|
| 1 | L | L | H |
| 0 | H | H | L |

| Data | PG | /PG | NG | PD |
|------|----|-----|-----|-----|
| 1    | L  | H   | L   | H   |
| 0    | H  | L   | H   | L   |

| Data | PG | NG | PD |
|------|----|----|----|
| 1    | L  | L  | H  |
| 0    | H  | H  | L  |

| Data | PG | VDDQ | NG | PD |
|------|----|------|----|----|
| 1    | L  | H    | L  | H  |
| 0    | H  | H    | H  | L  |

| Data | PG | NG | PD |
|------|----|----|-----|
| 1 | L | L | H |
| 0 | H | H | L |

| Data | PG | VDDQ | NG | PD |
|------|----|------|----|----|
| 1 | L | H | L | H |
| 0 | H | H | H | L |

| Data | PG | NG | PD |
|------|----|----|----|
| 1 | L | L | H |
| 0 | H | H | L |

| Data | PG | /PG | LP | NG | PD |
|------|----|----|----|----|----|
| 1 | L | H | L | L | H |
| 0 | H | L |  | H | L |

| Data | PG | /PG | LP | NG | PD |
|------|----|----|----|----|----|
| 1 | L | H | H | L | H |
| 0 | H | L |  | H | L |

| Data | PG | VDDQ | LP | NG | PD |
|------|----|----|----|----|----|
| 1 | L | H | L | L | H |
| 0 | H | H |   | H | L |

| Data | PG | VDDQ | LP | NG | PD |
|------|----|----|----|----|----|
| 1 | L | H | H | L | H |
| 0 | H | H |   | H | L |

| Data | PG2 | PG1 | NG | PD |
|------|-----|-----|----|----|
| 1 | L | L | L | H |
| 0 | L | H | H | L |

| Data | PG1 | PG2 | NG | PD |
|------|-----|-----|----|----|
| 1 | H | H | L | H |
| 0 | H | L | H | L |

DRIVER AND MEMORY CONTROLLER HAVING THE SAME

CROSS-REFERENCE TO RELATED APPLICATION

This application claims priority under 35 U.S.C. §119 to Korean Patent Application No. 10-2013-0044440 filed on Apr. 22, 2013, the disclosure of which is hereby incorporated by reference in its entirety.

BACKGROUND

Exemplary embodiments in accordance with principles of inventive concepts relate to memory controllers, and more particularly, to memory controllers including a driver, also referred to herein as a line driver, capable of selectively supporting a low power double data rate (LPDDR) transmission method.

Bandwidths of mobile memory devices applied to smart phones, tablet personal computers (PCs), ultra books, etc. have rapidly increased due to use of high-performance memory devices and multi-core application processors.

To maintain pace with these developments, mobile memory devices have been developed to support an LPDDR3 transmission method using VDDQ-TERM signaling, and an LPDDR4 transmission method using VSSQ-TERM signaling. Employing However, with a plurality of standards in use and with different signaling methods employed, memory devices that support one standard may not be used in an application that requires support for another standard.

SUMMARY

In exemplary embodiments in accordance with principles of inventive concepts, a bus line driver includes a first NMOS transistor connected between a ground voltage source and a first node, and controlled by a first signal; a second NMOS transistor connected between the first node and a second node, and controlled by a second signal; a first PMOS transistor connected between the second node and a power supply voltage source, and controlled by a third signal; and a pad connected to the first node, wherein, when a first transmission method is supported and the first PMOS transistor is activated, the power supply voltage is applied to the pad via the second NMOS transistor, and when a second transmission method is supported, the pad is connected to the second node.

In exemplary embodiments in accordance with principles of inventive concepts wherein the second and third signals have opposite phases.

In exemplary embodiments in accordance with principles of inventive concepts when the second transmission method is supported, the pad is connected to the second node using a metal revision, and when the first PMOS transistor is activated, the power supply voltage is applied to the pad via the second node.

In exemplary embodiments in accordance with principles of inventive concepts when the second transmission method is supported, the pad is connected to the second node via an anti-fuse, and when the first PMOS transistor is activated, the power supply voltage is applied to the pad via the second node.

In exemplary embodiments in accordance with principles of inventive concepts the power supply voltage is applied to the second signal.

In exemplary embodiments in accordance with principles of inventive concepts when the second transmission method is supported, the pad is connected to the second node using a metal revision, and when the first PMOS transistor is activated, the power supply voltage is applied to the pad via the second node.

In exemplary embodiments in accordance with principles of inventive concepts when the second transmission method is supported, the pad is connected to the second node via an anti-fuse, and when the first PMOS transistor is activated, the power supply voltage is applied to the pad via the second node.

In exemplary embodiments in accordance with principles of inventive concepts a bus line driver further comprises a second PMOS transistor connected between the second node and the pad, and controlled by a fourth signal.

In exemplary embodiments in accordance with principles of inventive concepts the second and third signals have opposite phases, and the first or second transmission method is supported according to the fourth signal.

In exemplary embodiments in accordance with principles of inventive concepts the power supply voltage is applied to the second signal, and the first or second transmission method is supported according to the fourth signal.

In exemplary embodiments in accordance with principles of inventive concepts a driver further comprises a first resistor connected between the first NMOS transistor and the first node; a second resistor connected between the second NMOS transistor and the second node; and a third resistor connected between the second node and the first PMOS transistor, wherein, when the first transmission method is supported, the first and second resistors increase linearity of an impedance, and when the second transmission method is supported, the first and third resistors increase linearity of impedance.

In exemplary embodiments in accordance with principles of inventive concepts the first transmission method comprises a low power dual data rate (LPDDR) 4 transmission method, and the second transmission method comprises an LPDDR3 transmission method.

In exemplary embodiments in accordance with principles of inventive concepts a memory controller comprises: a driver configured to transmit data to a semiconductor memory device supporting a first or second transmission method; and a data bus connected to the driver, and configured to transmit the data to and receive the data from the semiconductor memory device, wherein the driver comprises: a first NMOS transistor connected between a ground voltage source and a first node, and controlled by a first signal; a second NMOS transistor connected between the first node and a second node, and controlled by a second signal; a first PMOS transistor connected between the second node and a power supply voltage source, and controlled by a third signal; and a pad connected to the first node, wherein, when the first transmission method is supported and the first PMOS transistor is activated, a power supply voltage is applied to the pad via the second node, and when the second transmission method is supported, the pad is connected to the second node.

In exemplary embodiments in accordance with principles of inventive concepts a memory controller further comprises: a first resistor connected between the first NMOS transistor and the first node; a second resistor connected between the second NMOS transistor and the second node; and a third resistor connected between the second node and the first PMOS transistor, wherein, when the first transmission method is supported, the first and second resistors increase linearity of an impedance, and when the second transmission method is supported, the first and third resistors increase linearity of impedance.

In exemplary embodiments in accordance with principles of inventive concepts a memory controller further comprises a second PMOS transistor connected between the second node and the pad, and controlled by a fourth signal, the second and third signals have opposite phases, or the power supply voltage is applied to the second signal, and the first or second transmission method is supported according to the fourth signal.

In exemplary embodiments in accordance with principles of inventive concepts an electronic apparatus, comprises: a line driver including circuitry for low power double data rate 3 (LPDDR3) transmission; circuitry for low power double data rate 4 (LPDDR4) transmission; and selection circuitry for selecting between LPDDR3 and LPDDR4 transmission.

In exemplary embodiments in accordance with principles of inventive concepts a memory controller includes a line driver including circuitry for low power double data rate 3 (LPDDR3) transmission; circuitry for low power double data rate 4 (LPDDR4) transmission; and selection circuitry for selecting between LPDDR3 and LPDDR4 transmission.

In exemplary embodiments in accordance with principles of inventive concepts a memory system, includes: a line driver including circuitry for LPDDR3 transmission; circuitry for LPDDR4 transmission; and selection circuitry for selecting between LPDDR3 and LPDDR4 transmission and a plurality of memory devices arranged to be controlled by the memory controller.

In exemplary embodiments in accordance with principles of inventive concepts selection circuitry includes an antifuse.

In exemplary embodiments in accordance with principles of inventive concepts selection circuitry includes an optional final metallization trace.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DESCRIPTION

Figure 1:
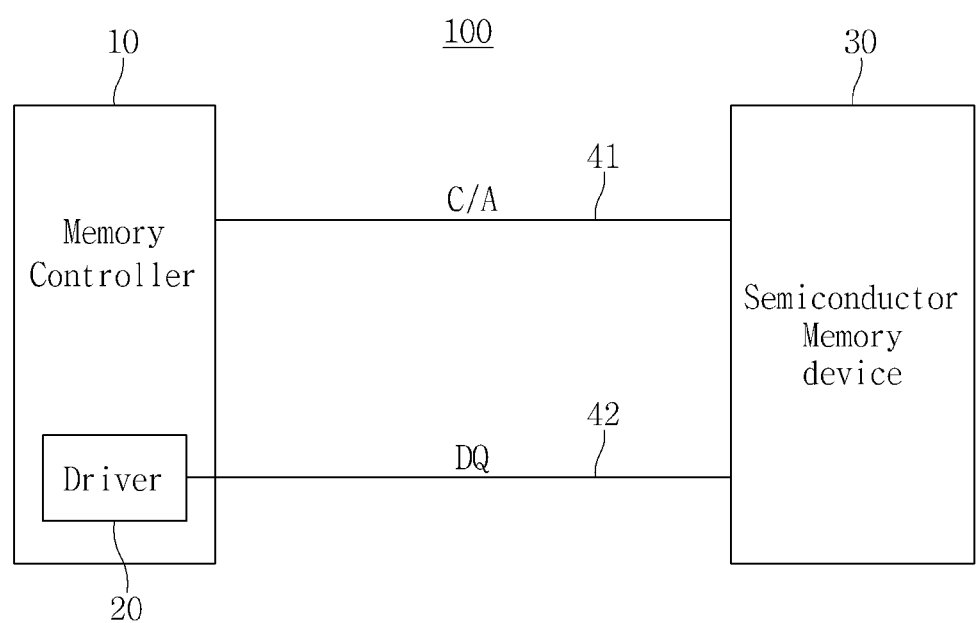
FIG. 1 is a block diagram of a memory system in accordance with principles of inventive concepts.

Various exemplary embodiments will be described more fully hereinafter with reference to the accompanying drawings, in which exemplary embodiments are shown. Exemplary embodiments may, however, be embodied in many different forms and should not be construed as limited to exemplary embodiments set forth herein. Rather, these exemplary embodiments are provided so that this disclosure will be thorough, and will convey the scope of exemplary embodiments to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items. The term "or" is used in an inclusive sense unless otherwise indicated.

It will be understood that, although the terms first, second, third, for example. may be used herein to describe various elements, components, regions, layers and/or sections, these elements, components, regions, layers and/or sections should not be limited by these terms. These terms are only used to distinguish one element, component, region, layer or section from another region, layer or section. In this manner, a first element, component, region, layer or section discussed below could be termed a second element, component, region, layer or section without departing from the teachings of exemplary embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. In this manner, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. In this manner, exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. In this manner, the regions illustrated in the figures are schematic in nature and their shapes are not intended to illustrate the actual shape of a region of a device and are not intended to limit the scope of exemplary embodiments.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments in accordance with principles of inventive concepts will be explained in detail with reference to the accompanying drawings.

In exemplary embodiments in accordance with principles of inventive concepts a memory controller, or a line driver that operates as a component of a memory controller, may support a plurality of memory data transmission methods, such as low power double data rate 3 (LPDDR3) or low power double data rated 4 (LPDDR4), for example.

Drivers in accordance with principles of inventive concepts, such as those referred to below as first to sixth embodiments may selectively support a low power double data rate 3 (LPDDR3) transmission method or a low power double data rate 4 (LPDDR4) transmission method, for example.

Specifically, the drivers of the first to sixth embodiments in accordance with principles of inventive concepts may select the LPDDR3 or LPDDR4 transmission method using a metal revision, for example. A first exemplary embodiment of a driver in accordance with principles of inventive concepts will be described with reference to FIGS. 4A to 4D below. A third exemplary embodiment of a driver in accordance with principles of inventive concepts will be described with reference to FIGS. 5A to 5D below.

Second and fourth exemplary embodiments of drivers in accordance with principles of inventive concepts may select the LPDDR3 or LPDDR4 transmission method via an antifuse. A second exemplary embodiment of a driver in accordance with principles of inventive concepts will be described with reference to FIGS. 4E to 4G below. A fourth exemplary embodiment of a driver in accordance with principles of inventive concepts will be described with reference to FIGS. 5E to 5G below.

Fifth and sixth exemplary embodiments of drivers in accordance with principles of inventive concepts may select the LPDDR3 or LPDDR4 transmission method by controlling a PMOS transistor. The fifth exemplary embodiment of a driver in accordance with principles of inventive concepts will be described with reference to FIGS. 6A to 6C below. The sixth exemplary embodiment of a driver in accordance with principles of inventive concepts will be described with reference to FIG. 7A to FIG. 7C below.

An exemplary embodiment of a memory system 100 in accordance with principles of inventive concepts is depicted in the block diagram of FIG. 1 in accordance with principles of inventive concepts the memory system 100 may include a memory controller 10 and a semiconductor memory device 30. The memory controller 10 may generate a command/address signal C/A and a data signal DQ, for example, and may include a driver 20 to transmit a data signal DQ.

The driver 20 may transmit a logic high signal to a data bus 42 via a pull-up transistor, and may transmit a logic low signal to the data bus 42 via a pull-down transistor, for example. The drivers of the first to sixth embodiments in accordance in accordance with principles of inventive concepts will be described in greater detail with reference to FIGS. 4A to 8C below.

Driver 20 may transmit data to the semiconductor memory device 30 according to the LPDDR3 or LPDDR4 transmission method. The LPDDR3 transmission method will be described with reference to FIGS. 2A and 2B below, and the LPDDR4 transmission method will be described with reference to FIGS. 3A and 3B below.

The semiconductor memory device 30 may operate according to the command/address signal C/A and the data signal DQ. The command/address signal C/A may be packet data obtained by combining a command signal and an address signal in the form of a packet. In accordance with principles of inventive concepts, the semiconductor memory device 30 may be embodied as a dynamic random access memory (DRAM), for example.

In exemplary embodiments in accordance with principles of inventive concepts command/address bus 41 may have a fly-by structure, and may be electrically connected to the semiconductor memory device 30. The data signal DQ may be exchanged between the memory controller 10 and the semiconductor memory device 30 via the data bus 42.

Figure 2A:
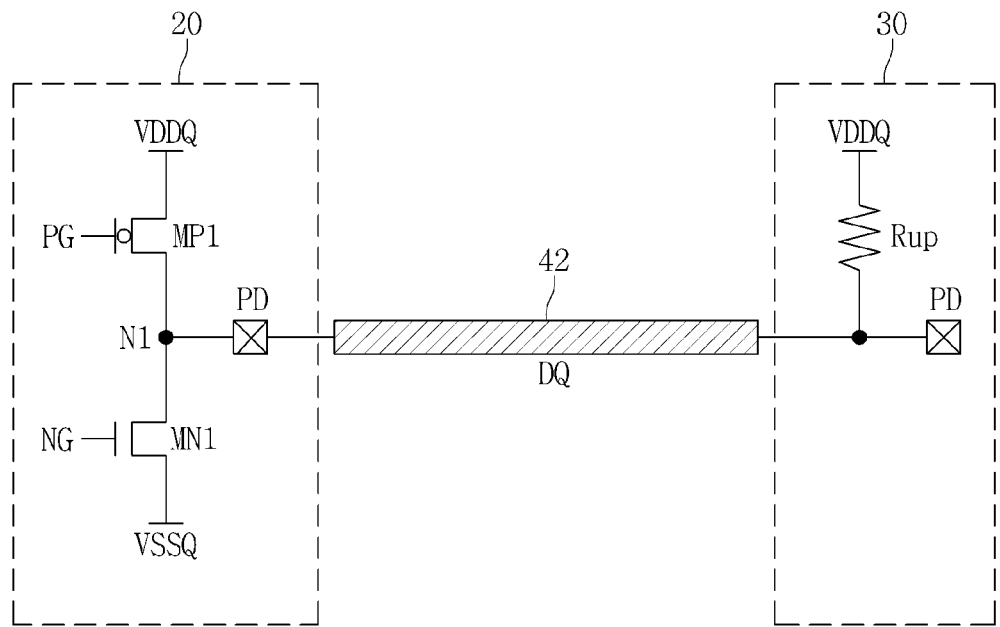
FIG. 2A is a detailed diagram illustrating a driver supporting a low power double data rate 3 (LPDDR3) transmission method in accordance with principles of inventive concepts.

FIG. 2A is a detailed diagram illustrating an exemplary embodiment of a driver 20 supporting the LPDDR3 transmission method in accordance with principles of inventive concepts Driver 20 may include an NMOS transistor MN1 connected between a ground voltage VSSQ source and a first node N1 and controlled by a signal NG, and a PMOS transistor MP1 connected between the first node N1 and a power supply voltage VDDQ source and controlled by a signal PG. A pad PD of the driver 20 may be connected to the first node N1. Pad PD of the memory device 30 may be connected to a pull-up resistor Rup. A data bus 42 (also referred to herein as a line of a data bust 42) may be connected between the pad PD of the driver 20 and the pad PD of the memory device 30.

Figure 2B:
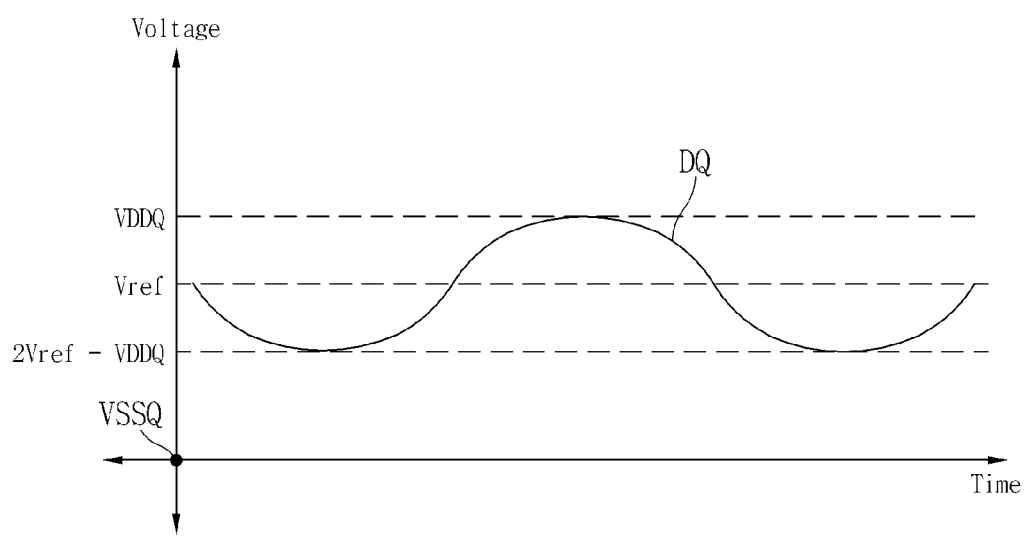
FIG. 2B is a graph illustrating a data signal illustrated in FIG. 2A.

FIG. 2B is a graph illustrating an exemplary data signal DQ illustrated in FIG. 2A.

Referring to FIGS. 2A and 2B, the X-axis denotes time and the Y-axis denotes a voltage. A logic state of the data signal DQ may change between a ground voltage VSSQ and a power supply voltage VDDQ. A reference voltage Vref may be maintained to be higher than VDDQ/2 due to the pull-up resistor Rup connected to the pad PD of the memory device 30.

The data signal DQ may be determined to be logic high ("1") when a voltage of the data signal DQ is higher than the reference voltage Vref, and may be determined to be logic low ("0") when the voltage of the data signal DQ is lower than the reference voltage Vref.

When the data signal DQ is '1', the PMOS transistor MP1, which is a pull-up transistor, may be activated to cause the data bus 42 to have a logic high state. When the data signal DQ is '0', the NMOS transistor MN1 which is a pull-down transistor, may be activated to cause the data bus 42 to have a logic low state.

Figure 3A:
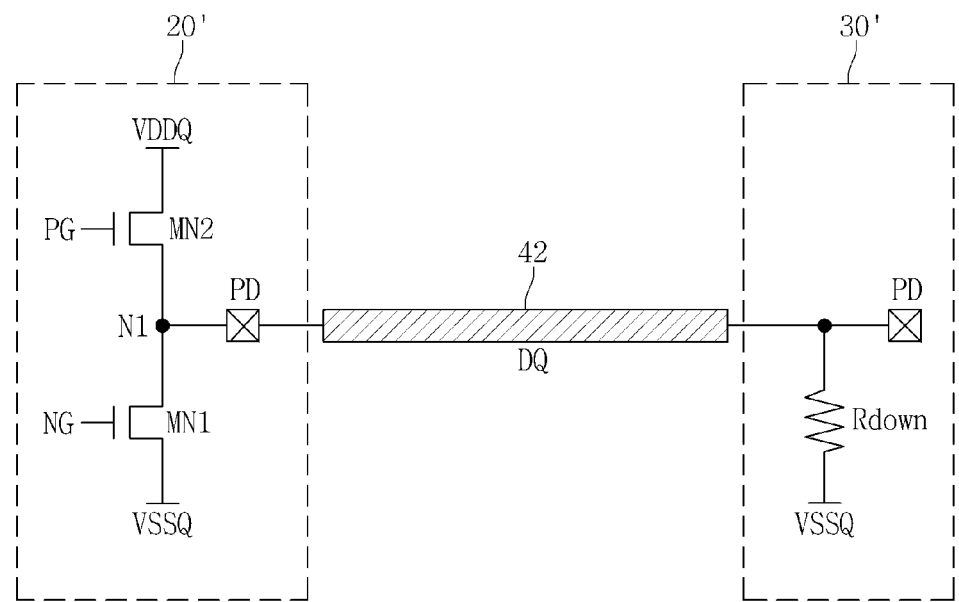
FIG. 3A is a detailed diagram illustrating a driver supporting a low power double data rate 4 (LPDDR4) transmission method in accordance with principles of inventive concepts.

FIG. 3A is a detailed diagram illustrating an exemplary embodiment of a driver 20' supporting the LPDDR4 transmission method in accordance with principles of inventive concepts. Driver 20' may include a first NMOS transistor MN1 connected between a ground voltage VSSQ source and a first node N1 and controlled by a signal NG, and a second NMOS transistor MN2 connected between the first node N1 and a power supply voltage VDDQ source and controlled by a signal PG. A pad PD of the driver 20' may be connected to the first node N1. A pad PD of a memory device 30' may be connected to a pull-down resistor Rdown. A data bus 42, or data bust line 42, may be connected between the pad PD of the driver 20' and the pad PD of the memory device 30'.

Figure 3B:
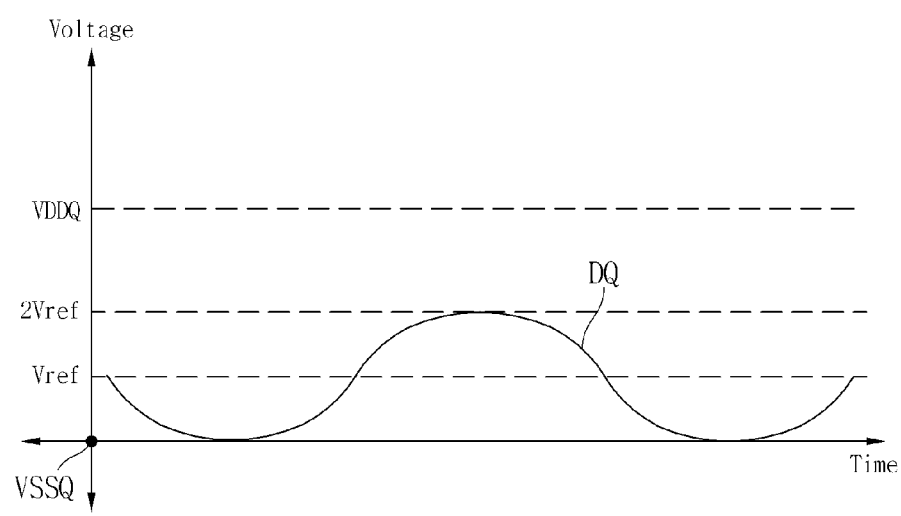
FIG. 3B is a graph illustrating a data signal illustrated in FIG. 3A.

FIG. 3B is a graph illustrating an exemplary embodiment of a data signal DQ in accordance with principles of inventive concepts, such as that illustrated in FIG. 3A.

Referring to FIGS. 3A and 3B, the X-axis denotes time and the Y-axis denotes a voltage. A logic state of the data signal DQ may change between a ground voltage VSSQ and a power supply voltage VDDQ. A reference voltage Vref may be maintained to be lower than VDDQ/2 due to the pull-down resistor Rdown connected to an input/output pad of the memory device 30'.

The data signal DQ may be determined to be logic high when a voltage of the data signal DQ is higher than the reference voltage Vref, and may be determined to be logic low when the voltage of the data signal DQ is lower than the reference voltage Vref.

When the data signal DQ is '1', the PMOS transistor MP1 may be activated to cause the data bus 42 to have a logic high state. When the data signal DQ is '0', the NMOS transistor MN1 may be activated to cause the data bus 42 to have a logic low state.

In exemplary embodiments in accordance with principles of inventive concepts, in the LPDDR3 transmission method, the data bus 42 may be caused to have a logic high state using the PMOS transistor MP1 and, in contrast, in the LPDDR4 transmission method, the data bus 42 may be caused to have a logic high state using a drive of the NMOS transistor MN1.

The driver 21 in a first exemplary embodiment in accordance with principles of inventive concepts may select the LPDDR3 or LPDDR4 transmission method using a metal revision. In exemplary embodiments in accordance with principles of inventive concepts, the term metal revision refers to a process of changing a circuit's layout by changing only a final metal process during a semiconductor manufacturing process. In accordance with principles of inventive concepts, the driver 21 in accordance with the first embodiment may support the LPDDR3 transmission method when the metal revision is not used, and may support the LPDDR4 transmission method when the metal revision is used (or vice versa).

Figures 4A, 4B:
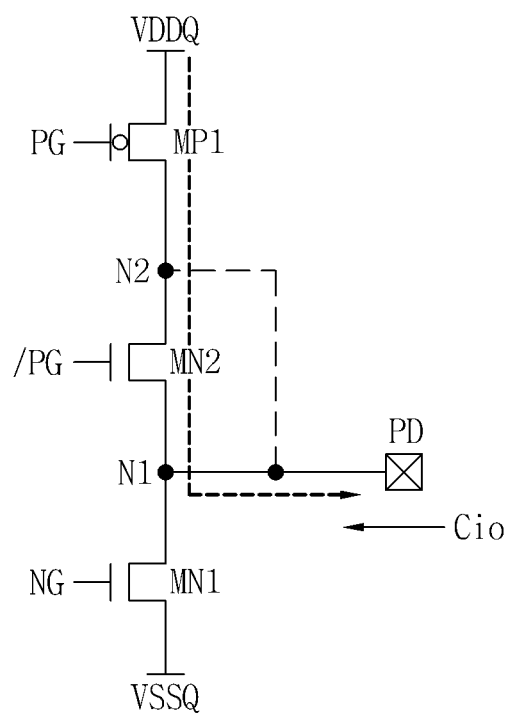
FIG. 4A is a circuit diagram of a driver in accordance with a first embodiment of the inventive concept.
FIG. 4B is a table illustrating an operation of the driver of FIG. 4A.

FIG. 4A is a circuit diagram of the driver 21 in a first exemplary embodiment in accordance with principles of inventive concepts. A driver 21 in accordance with principles of inventive concepts that does not employ a metal revision process may include a first NMOS transistor MN1 connected to a ground voltage VSSQ source and a first node N1 and controlled by a signal NG, a second NMOS transistor MN2 connected between the first node N1 and a second node N2 and controlled by a signal /PG, and a PMOS transistor MP1 connected between the second node N2 and a power supply voltage VDDQ source and controlled by a signal PG. The signal PG may have a phase opposite to that of the signal /PG signal. A pad PD may be connected to the first node N1.

FIG. 4B is a table illustrating an operation of a driver 21 in accordance with principles of inventive concepts such as that of FIG. 4A.

Referring to FIGS. 4A and 4B, when a data signal DQ is '1', the PMOS transistor MP1 and the second NMOS transistor MN2 may be activated, and the first NMOS transistor MN1 may be deactivated. That is, the signal PG may be maintained to be logic low to activate the PMOS transistor MP1, and the signal /PG may be maintained to be logic high so that the second NMOS transistor MN2 may apply a power supply voltage VDDQ to the pad PD. Additionally, the NG signal may be maintained to be logic low to deactivate the first NMOS transistor MN1. In this manner, the pad PD may have a logic high state.

On the other hand, when the data signal DQ is '0', the PMOS transistor MP1 and the second NMOS transistor MN2 may be deactivated, and the first NMOS transistor MN1 may be activated. That is, the signal PG may be maintained to be logic high and the signal /PG may be maintained to be logic low so as to deactivate the PMOS transistor MP1. Additionally, the signal NG may be maintained to be logic high to activate the first NMOS transistor MN1. Accordingly, the pad PD may have a logic low state.

The driver 21 may cause the data bus 42 to have the logic high state via the second NMOS transistor MN2. In this manner, the memory controller 10 including the driver 21 in a first exemplary embodiment in accordance with principles of inventive concepts may control the memory device 30 supporting the LPDDR4 transmission method.

Input capacitance Cio refers to the capacitance when the pad PD of the driver 21 is viewed at an input terminal, i.e., the memory device 30. Additionally, transistors that constitute the driver 21 may be modeled as capacitors. The driver 21 may output the power supply voltage VDDQ via the PMOS transistor MP1 and the second NMOS transistor MN2. That is, the driver 21 may be modeled as two capacitors connected in series. In this manner, the driver 21 may have a lower capacitance than that of the driver 20 of FIG. 2A, or that of the driver 20' of FIG. 3A, for example, thereby allowing for higher operating speeds.

Figures 4C, 4D:
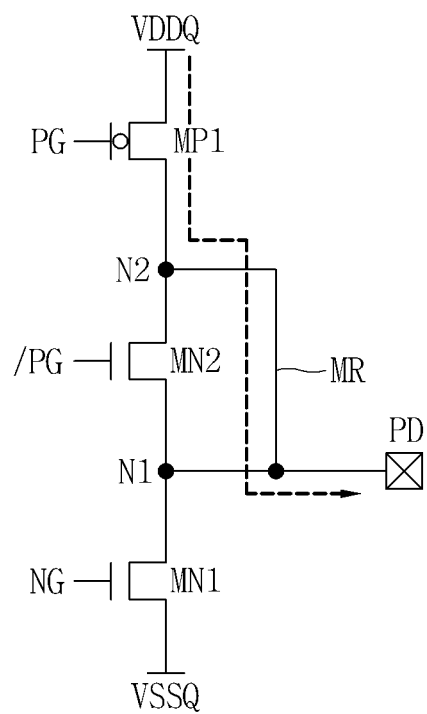
FIG. 4C is a circuit diagram of a result of reconfiguring the driver of FIG. 4A using a metal revision.
FIG. 4D is a table illustrating an operation of the driver of FIG. 4C.

FIG. 4C is a circuit diagram of a result of reconfiguring the driver 21 of FIG. 4A using a metal revision MR in accordance with principles of inventive concepts.

Referring to FIG. 4C, the driver 21 to which the metal revision MR is applied may include a first NMOS transistor MN1 connected between a ground voltage VSSQ source and a first node N1 and controlled by a signal NG, a second NMOS transistor MN2 connected between the first node N1 and a second node N2 and controlled by a signal /PG, and a PMOS transistor MP1 connected between the second node N2 and a power supply voltage VDDQ source and controlled by a signal PG signal. The PG signal may have a phase opposite to that of the signal /PG.

A pad PD may be connected to the first node N1. Additionally, the pad PD is connected to the second node N2 using the metal revision MR. In this manner, a power supply voltage VDDQ may be applied to the pad PD via the PMOS transistor MP1 without using the second NMOS transistor MN2.

FIG. 4D is a table illustrating an operation of the driver 21 of FIG. 4C.

Referring to FIGS. 4C and 4D, when the data signal DQ is '1', the PMOS transistor MP1 may be activated, and the first NMOS transistor MN1 may be deactivated. That is, the signal PG may be maintained to be logic low to activate the PMOS transistor MP1. Because the pad PD may be directly connected to the second node N2 using the metal revision MR, the PMOS transistor MP1 may cause the data bus 42 to have the logic high state via the pad PD. Additionally, the signal NG may be maintained to be logic low to deactivate the first NMOS transistor MN1. Accordingly, the pad PD may have the logic high state.

On the other hand, when the data signal DQ is '0', the PMOS transistor MP1 may be deactivated, and the first NMOS transistor MN1 may be activated. That is, the signal PG may be maintained to be logic low to deactivate the PMOS transistor MP1. Additionally, the signal NG may be maintained to be logic high to activate the first NMOS transistor MN1. Accordingly, the pad PD may have the logic low state.

The driver 21 may cause the data bus 42 to have the logic high state via the PMOS transistor MP1. In this manner, the memory controller 10 including the driver 21 in a first exemplary embodiment in accordance with principles of inventive concepts may control the memory device 30 supporting the LPDDR3 transmission method.

A driver 22 in a second exemplary embodiment in accordance with principles of inventive concepts may select the LPDDR3 or LPDDR4 transmission method via an anti-fuse. A fuse blocks a connection via a metal line when the fuse is fused, or activated, whereas the anti-fuse allows a connection via the blocked metal line when the anti-fuse is fused. In this manner, the driver 22 in a second exemplary embodiment in accordance with principles of inventive concepts may support the LPDDR4 transmission method when the anti-fuse is fused, and may support the LPDDR3 transmission method when the anti-fuse is not fused.

Figures 4E, 4F, 4G:
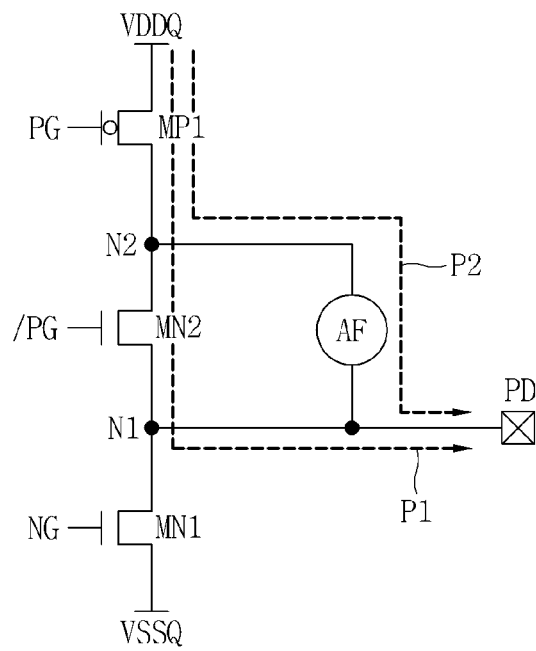
FIG. 4E is a circuit diagram of a driver in accordance with a second embodiment of the inventive concept.
FIG. 4F is a table illustrating an operation of the driver of FIG. 4E which supports the LPDDR4 transmission method.
FIG. 4G is a table illustrating an operation of the driver of FIG. 4E which supports the LPDDR3 transmission method.

FIG. 4E is a circuit diagram of the driver 22 in a second exemplary embodiment in accordance with principles of inventive concepts.

Referring to FIG. 4E, the driver 22 may include a first NMOS transistor MN1 connected between a ground voltage VSSQ source and a first node N1 and controlled by a signal NG, a second NMOS transistor MN2 connected between the first node N1 and a second node N2 and controlled by a signal /PG, and a PMOS transistor MP1 connected between the second node N2 and a power supply voltage VDDQ source and controlled by a signal PG. The signal PG may have a phase opposite to that of the signal /PG.

A pad PD may be connected to the first node N1, and may also be connected to the second node N2 via an anti-fuse AF. In this manner, when the anti-fuse AF is fused, a power supply voltage VDDQ may be applied to the pad PD via the PMOS transistor MP1 without using the second NMOS transistor MN2. When the anti-fuse AF is not fused, the power supply voltage VDDQ may be applied to the pad PD via the second NMOS transistor MN2.

FIG. 4F is a table illustrating operation of a driver in accordance with principles of inventive concepts such as that of FIG. 4E supporting the LPDDR4 transmission method Referring to FIGS. 4E and 4F, when the anti-fuse AF is not fused, the driver 22 may support the LPDDR4 transmission method.

When the data signal DQ is '1', the PMOS transistor MP1 and the second NMOS transistor MN2 may be activated, and the first NMOS transistor MN1 may be deactivated. That is, the signal PG may be maintained to be logic low to activate the PMOS transistor MP1, and the signal /PG may be maintained to be logic high so that the second NMOS transistor MN2 may apply the power supply voltage VDDQ to the pad PD. Additionally, the signal NG may be maintained to be logic low to deactivate the first NMOS transistor MN1. That is, the power supply voltage VDDQ may be applied to the pad PD in a first path P1. In this manner, the pad PD may have the logic high state.

On the other hand, when the data signal DQ is '0', the PMOS transistor MP1 and the second NMOS transistor MN2 may be deactivated, and the first NMOS transistor MN1 may be activated. That is, the signal PG signal may be maintained to be logic high and the signal /PG may be maintained to be logic low so as to deactivate the PMOS transistor MP1. Additionally, the signal NG may be maintained to be logic high to activate the first NMOS transistor MN1. In this manner, the pad PD may have the logic low state.

The driver 22 may cause the data bus 42 to have the logic high state via the second NMOS transistor MN2. In this manner, the memory controller 10 including the driver 22 in a second exemplary embodiment in accordance with principles of inventive concepts may control the memory device 30 supporting the LPDDR4 transmission method.

FIG. 4G is a table illustrating an operation of the driver 22 of FIG. 4E supporting the LPDDR3 transmission method.

Referring to FIGS. 4E and 4G, when a data signal DQ is '1', the PMOS transistor MP1 may be activated, and the first NMOS transistor MN1 may be deactivated. That is, the signal PG may be maintained to be logic low to activate the PMOS transistor MP1. The pad PD is directly connected to the second node N2 via the anti-fuse AF. The PMOS transistor MP1 may in this manner cause the data bus 42 to have a logic high state via the pad PD. Additionally, the signal NG may be maintained to be logic low to deactivate the first NMOS transistor MN1. That is, the power supply voltage VDDQ may be applied to the pad PD in a second path P2. In this manner, the pad PD may have a logic high state.

On the other hand, when the data signal DQ is '0', the PMOS transistor MP1 may be deactivated, and the first NMOS transistor MN1 may be activated. That is, the signal PG may be maintained to be logic high to deactivate the PMOS transistor MP1. Additionally, the signal NG may be maintained to be logic high to activate the first NMOS transistor MN1. In this manner, the pad PD may have a logic low state.

The driver 22 may cause the data bus 42 to have a logic high state via the PMOS transistor MP1. In this manner, the memory controller 10 including the driver 22 in a second exemplary embodiment in accordance with principles of inventive concepts may control the memory device 30 supporting the LPDDR3 transmission method.

Figures 5A, 5B:
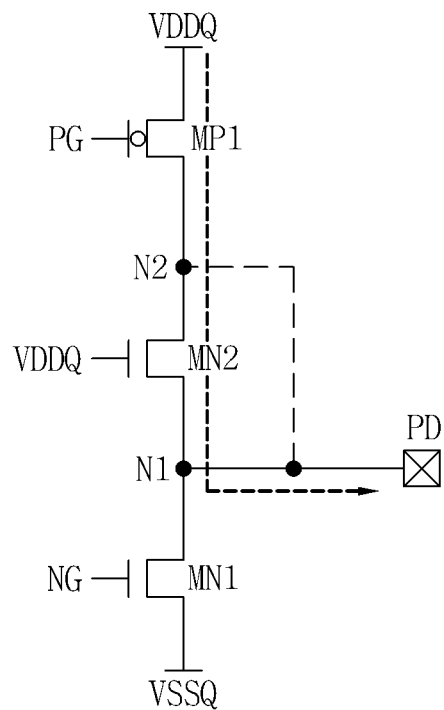
FIG. 5A is a circuit diagram of a driver in a third exemplary embodiment in accordance with principles of inventive concepts.
FIG. 5B is a table illustrating an operation of the driver of FIG. 5A.

FIG. 5A is a circuit diagram of a driver 23 in accordance with a third exemplary embodiment in accordance with principles of inventive concepts.

Referring to FIG. 5A, driver 23 with which a metal revision process is not used may include a first NMOS transistor MN1 connected between a ground voltage VSSQ source and a first node N1 and controlled by a signal NG signal, a second NMOS transistor MN2 connected between the first node N1 and a second node N2 and including a gate to which a power supply voltage VDDQ is applied, and a PMOS transistor MP1 connected between the second node N2 and a power supply voltage VDDQ source and controlled by a signal PG. A pad PD may be connected to the first node N1.

FIG. 5B is a table illustrating the operation of an exemplary embodiment of a driver 23 in accordance with principles of inventive concepts such as that of FIG. 5A;

Referring to FIGS. 5A and 5B, when a data signal DQ is '1', the PMOS transistor MP1 and the second NMOS transistor MN2 may be activated, and the first NMOS transistor MN1 may be deactivated. That is, the signal PG may be maintained to be logic low to activate the PMOS transistor MP1. Because the power supply voltage VDDQ is applied to the gate of the second NMOS transistor MN2, the power supply voltage VDDQ may be applied to the pad PD. Additionally, the signal NG may be maintained to be logic low to deactivate the first NMOS transistor MN1. Accordingly, the pad PD may have a logic high state.

On the other hand, when the data signal DQ is '0', the PMOS transistor MP1 and the second NMOS transistor MN2 may be deactivated, and the first NMOS transistor MN1 may be activated. That is, the signal PG may be maintained to be logic high to deactivate the PMOS transistor MP1. Additionally, the signal NG may be maintained to be logic high to activate the first NMOS transistor MN1. Accordingly, the pad PD may have a logic low state.

The driver 23 in a third exemplary embodiment in accordance with principles of inventive concepts may cause the data bus 42 to have a logic high state via the second NMOS transistor MN2. In this manner, the memory controller 10 including the driver 23 in a third exemplary embodiment in accordance with principles of inventive concepts may control the memory device 30 supporting the LPDDR4 transmission method.

Figures 5C, 5D:
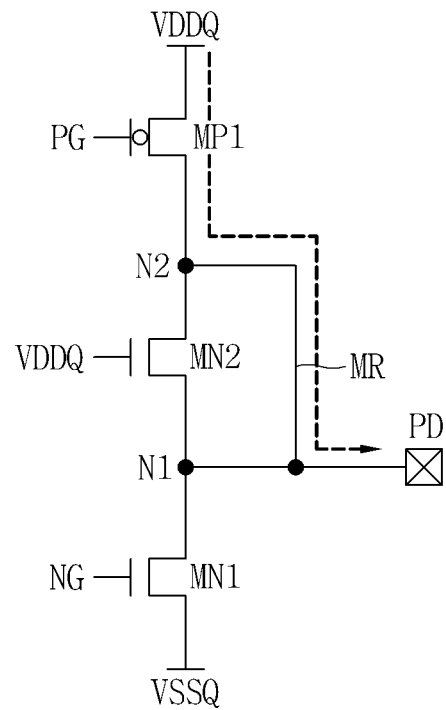
FIG. 5C is a circuit diagram of a result of reconfiguring the driver of FIG. 5A using the (a) metal revision.
FIG. 5D is a table illustrating an operation of the driver of FIG. 5C.

FIG. 5C is a circuit diagram of a result of reconfiguring the driver 23 of FIG. 5A using the (a) metal revision MR.

Referring to FIG. 5C, the driver 21 to which a metal revision MR is applied may include a first NMOS transistor MN1 connected between a ground voltage VSSQ source and a first node N1 and controlled by a signal NG, a second NMOS transistor MN2 connected between the first node N1 and a second node N2 and including a gate to which a power supply voltage VDDQ is applied, and a PMOS transistor MP1 connected between the second node N2 and a power supply voltage VDDQ source and controlled by a signal PG signal.

A pad PD may be connected to the first node N1, and may also be connected to the second node N2 using the metal revision MR. In this manner, the power supply voltage VDDQ may be applied to the pad PD via the PMOS transistor MP1 without using the second NMOS transistor MN2.

FIG. 5D is a table illustrating an operation of the driver 23 of FIG. 5C,

Referring to FIGS. 5C and 5D, when the data signal DQ is '1', the PMOS transistor MP1 may be activated, and the first NMOS transistor MN1 may be deactivated. That is, the signal PG may be maintained to be logic low to activate the PMOS transistor MP1. Because the pad PD is directly connected to the second node N2 using the metal revision MR, the PMOS transistor MP1 may cause the data bus 42 to have a logic high state via the pad PD. Additionally, the signal NG may be maintained to be logic low to deactivate the first NMOS transistor MN1. Accordingly, the pad PD may have a logic high state.

On the other hand, when the data signal DQ is '0', the PMOS transistor MP1 may be deactivated, and the first NMOS transistor MN1 may be activated. That is, the signal PG may be maintained to be logic high to deactivate the PMOS transistor. Additionally, the signal NG may be maintained to be logic high to activate the first NMOS transistor MN1. Accordingly, the pad PD may have a logic low state.

The driver 23 may cause the data bus 42 to have a logic high state via the PMOS transistor MP1. In this manner, the memory controller 10 including the driver 23 in a third exemplary embodiment in accordance with principles of inventive concepts may control the memory device 30 supporting the LPDDR3 transmission method.

Figures 5E, 5F, 5G:
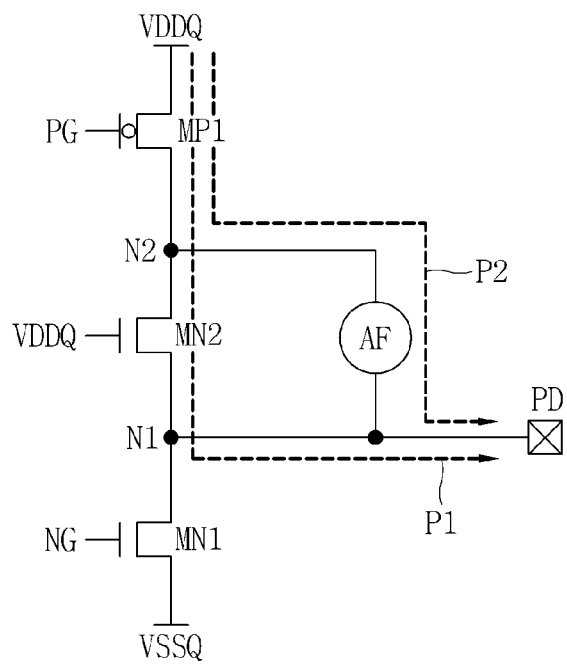
FIG. 5E is a circuit diagram of a driver in a fourth exemplary embodiment in accordance with principles of inventive concepts.
FIG. 5F is a table illustrating an operation of the driver of FIG. 5E which supports the LPDDR4 transmission method.
FIG. 5G is a table illustrating an operation of the driver of FIG. 5E which supports the LPDDR3 transmission method.

FIG. 5E is a circuit diagram of a driver 24 in a fourth exemplary embodiment in accordance with principles of inventive concepts.

Referring to FIG. 5E, the driver 24 may include a first NMOS transistor MN1 connected between a ground voltage VSSQ source and a first node N1 and controlled by a signal NG, a second NMOS transistor MN2 connected between the first node N1 and a second node N2 and including a gate to which a power supply voltage VDDQ is applied, and a PMOS transistor MP1 connected between the second node N2 and a power supply voltage VDDQ source and controlled by a signal PG.

A pad PD may be connected to the first node N1, and may also be connected to the second node N2 via an anti-fuse AF. When the anti-fuse AF is fused, the power supply voltage VDDQ may be applied to the pad PD via the PMOS transistor MP1 without using the second NMOS transistor MN2. When the anti-fuse AF is not fused, the power supply voltage VDDQ may be applied to the pad PD via the second NMOS transistor MN2.

FIG. 5F is a table illustrating an operation of the driver 24 of FIG. 5E supporting the LPDDR4 transmission method.

Referring to FIGS. 5E and 5F, when the anti-fuse AF is not fused, the driver 24 may support the LPDDR4 transmission method.

When a data signal DQ is '1', the PMOS transistor MP1 and the second NMOS transistor MN2 may be activated, and the first NMOS transistor MN1 may be deactivated. That is, the signal PG may be maintained to be logic low to activate the PMOS transistor MP1. Because the power supply voltage VDDQ is applied to the gate of the second NMOS transistor MN2, the power supply voltage VDDQ may be applied to the pad PD. Additionally, the signal NG may be maintained to be logic low to deactivate the first NMOS transistor MN1. That is, the power supply voltage VDDQ may be applied to the pad PD in a first path P1. Accordingly, the pad PD may have a logic high state.

On the other hand, when the data signal DQ is '0', the PMOS transistor MP1 and the second NMOS transistor MN2 may be deactivated, and the first NMOS transistor MN1 may be activated. In other words, the signal PG may be maintained to be logic high to deactivate the PMOS transistor MP1. Additionally, the signal NG may be maintained to be logic high to activate the first NMOS transistor MN1. Accordingly, the pad PD may have a logic low state.

The driver 24 may cause the data bus 42 to have a logic high state via the second NMOS transistor MP2. In this manner, the memory controller 10 including the driver 24 in a fourth exemplary embodiment in accordance with principles of inventive concepts may control the memory device 30 supporting the LPDDR4 transmission method.

FIG. 5G is a table illustrating an operation of the driver 24 of FIG. 5E supporting the LPDDR3 transmission method.

Referring to FIGS. 5E and 5G, when a data signal DQ is '1', the PMOS transistor MP1 may be activated, and the first NMOS transistor MN1 may be deactivated. That is, the signal PG may be maintained to be logic low to activate the PMOS transistor MP1. Because the pad PD is directly connected to the second node N2 via the anti-fuse AF, the PMOS transistor MP1 may cause the data bus 42 to have a logic high state via the pad PD. Additionally, the signal NG may be maintained to be logic low to deactivate the first NMOS transistor MN1. That is, the power supply voltage VDDQ may be applied to the pad PD in a second path P2. Accordingly, the pad PD may have a logic high state.

On the other hand, when the data signal DQ is '01', the PMOS transistor MP1 may be deactivated, and the first NMOS transistor MN1 may be activated. That is, the signal PG may be maintained to be logic high to deactivate PMOS transistor MP1. Additionally, the signal NG may be maintained to be logic high to activate the first NMOS transistor MN1. Accordingly, the pad PD may have a logic low state.

The driver 24 may cause the data bus 42 to have a logic high state via the PMOS transistor MP1. In this manner, the memory controller 10 including the driver 24 in a fourth exemplary embodiment in accordance with principles of inventive concepts may control the memory device 30 supporting the LPDDR3 transmission method.

Figures 6A, 6B, 6C:
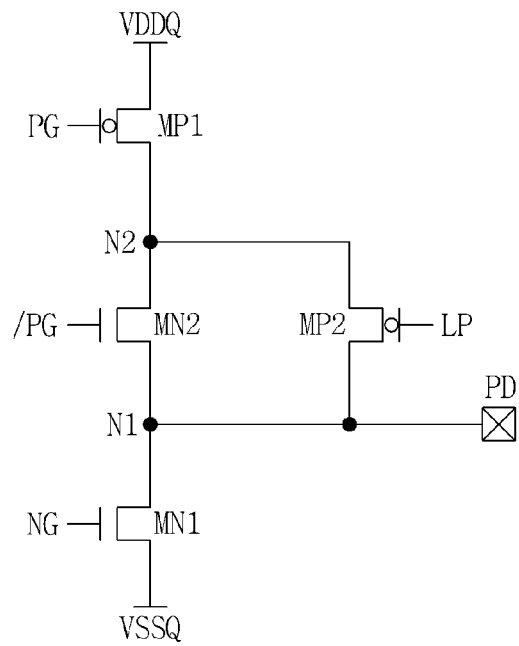
FIG. 6A is a circuit diagram of a driver in a fifth exemplary embodiment in accordance with principles of inventive concepts.
FIG. 6B is a table illustrating an operation of the driver of FIG. 6A which supports the LPDDR3 transmission method.
FIG. 6C is a table illustrating an operation of the driver of FIG. 6A which supports the LPDDR4 transmission method.

FIG. 6A is a circuit diagram of a driver 25 in a fifth exemplary embodiment in accordance with principles of inventive concepts.

Referring to FIG. 6A, the driver 25 may include a first NMOS transistor MN1 connected between a ground voltage VSSQ source and a first node N1 and controlled by a signal NG, a second NMOS transistor MN2 connected between the first node N1 and a second node N2 and controlled by a signal /PG, a first PMOS transistor MP1 connected between the second node N2 and a power supply voltage VDDQ source and controlled by a signal PG, and a second PMOS transistor MP2 connected between the first node N1 and the second node N2 and controlled by a signal LP. The signal PG may have a phase opposite to that of the signal /PG.

A pad PD may be connected to the first node N1, and may also be connected to the second node N2 via the second PMOS transistor MP2.

When the LP signal is logic low, a power supply voltage VDDQ may be applied to the pad PD via the first PMOS transistor MP1 without using the second NMOS transistor MN2. When the LP signal is logic high, the power supply voltage VDDQ may be applied to the pad PD via the second NMOS transistor MN2. In other words, the driver 25 may support the LPDDR3 transmission method when the LP signal is logic low, and may support the LPDDR4 transmission method when the LP signal is logic high.

FIG. 6B is a table illustrating an operation of the driver 25 of FIG. 6A supporting the LPDDR3 transmission method.

Referring to FIGS. 6A and 6B, the memory controller 10 may maintain the LP signal to be logic low to support the LPDDR3 transmission method.

When a data signal DQ is '1', the first PMOS transistor MP1, the second NMOS transistor MN2, and the second PMOS transistor MP2 may be activated. The second NMOS transistor MN2 and the second PMOS transistor MP2 may act as transmission gates. That is, an output of the first PMOS transistor MP1 may be delivered to the pad PD via the transmission gates.

Additionally, the first NMOS transistor MN1 may be deactivated. That is, the signal PG may be maintained to be logic low to activate the first PMOS transistor MP1.

Because the pad PD is directly connected to the second node N2 via the second PMOS transistor MP2, the first PMOS transistor MP1 may cause the data bus 42 to have a logic high state via the pad PD. Additionally, the signal NG may be maintained to be logic low to deactivate the first NMOS transistor MN1. Accordingly, the pad PD may have a logic high state.

On the other hand, when the data signal DQ is '0', the first PMOS transistor MP1 and the second NMOS transistor MN2 may be deactivated, and the first NMOS transistor MN1 may be activated. That is, the signal PG may be maintained to be logic high to deactivate the first PMOS transistor MP1. Additionally, the signal NG may be maintained to be logic high to deactivate the first NMOS transistor MN1. Accordingly, the pad PD may have a logic low state.

The driver 25 may cause the data bus 42 to have a logic high state via the second NMOS transistor MN2. In this manner, the memory controller 10 including the driver 25 in a fifth exemplary embodiment in accordance with principles of inventive concepts may control the memory device 30 supporting the LPDDR4 transmission method.

FIG. 6C is a table illustrating an operation of the driver 25 of FIG. 6A supporting the LPDDR4 transmission method.

Referring to FIGS. 6A and 6B, the memory controller 10 may maintain the signal LP to be logic high to support the LPDDR4 transmission method.

When a data signal DQ is '1', the first PMOS transistor MP1 and the second NMOS transistor MN2 may be activated, and the first NMOS transistor MN1 may be deactivated. That is, the signal PG may be maintained to be logic low to activate the first PMOS transistor MP1, and the signal /PG may be maintained to be logic high so that the second NMOS transistor MN2 may apply the power supply voltage VDDQ to the pad PD. Additionally, the signal NG may be maintained to be logic low to deactivate the first NMOS transistor MN1. Accordingly, the pad PD may have a logic high state.

On the other hand, when the data signal DQ is '0', the first PMOS transistor MP1 may be deactivated and the first NMOS transistor MN1 may be activated. That is, the signal PG may be maintained to be logic high and the signal /PG may be maintained to be logic low so as to deactivate the first PMOS transistor MP1. Additionally, the signal NG may be maintained to be logic high to activate the first NMOS transistor MN1. Accordingly, the pad PD may have a logic low state.

The driver 25 may cause the data bus to have a logic high state via the first PMOS transistor MP1. In this manner, the memory controller 10 including the driver 25 in a fifth exemplary embodiment in accordance with principles of inventive concepts may control the memory device 30 supporting the LPDDR3 transmission method.

Figures 7A, 7B, 7C:
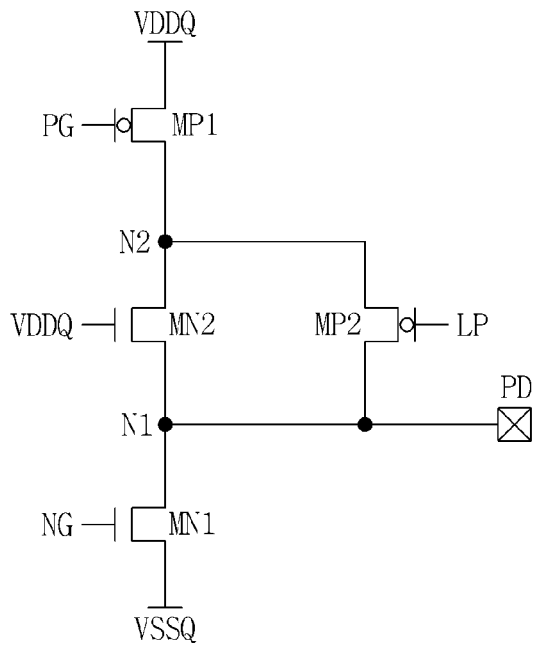
FIG. 7A is a circuit diagram of a driver in a sixth exemplary embodiment in accordance with principles of inventive concepts.
FIG. 7B is a table illustrating an operation of the driver of FIG. 7A which supports the LPDDR3 transmission method.
FIG. 7C is a table illustrating an operation of the driver of FIG. 7A which supports the LPDDR4 transmission method.

FIG. 7A is a circuit diagram of a driver 26 in a sixth exemplary embodiment in accordance with principles of inventive concepts.

Referring to FIG. 7A, the driver 26 may include a first NMOS transistor MN1 connected between a ground voltage VSSQ source and a first node N1 and controlled by a signal NG, a second NMOS transistor MN2 connected between the first node N1 and a second node N2 and including a gate to which a power supply voltage VDDQ is applied, a first PMOS transistor MP1 connected between the second node N2 and a power supply voltage VDDQ source and controlled by a signal PG, and a second PMOS transistor MP2 connected between the first node N1 and the second node N2 and controlled by a signal LP.

A pad PD may be connected to the first node N1, and may be connected to the second node N2 via the second PMOS transistor MP2.

When the signal LP is logic low, the power supply voltage VDDQ may be applied to the pad PD via the first PMOS transistor MP1 without using the second NMOS transistor MN2. When the signal LP is logic high, the power supply voltage VDDQ may be applied to the pad PD via the second NMOS transistor MN2. That is, the driver 25 may support the LPDDR3 transmission method when the signal LP is logic low, and may support the LPDDR4 transmission method when the signal LP is logic high.

FIG. 7B is a table illustrating an operation of the driver 26 of FIG. 7A supporting the LPDDR3 transmission method.

Referring to FIGS. 7A and 7B, the memory controller 10 may maintain the signal LP to be logic low to support the LPDDR3 transmission method. Additionally, because the power supply voltage VDDQ is applied to the gate of the second NMOS transistor MN2, the second NMOS transistor MN2 always remains activated.

When a data signal DQ is V, the first PMOS transistor MP1 and the second PMOS transistor MP2 may be activated. The second NMOS transistor MN2 and the second PMOS transistor MP2 may act as transmission gates. That is, an output of the first PMOS transistor MP1 may be supplied to the pad PD via the transmission gates.

Additionally, the first NMOS transistor MN1 may be deactivated. That is, the signal PG may be maintained to be logic low to activate the first PMOS transistor MP1.

The first PMOS transistor MP1 may be activated, and the first NMOS transistor MN1 may be deactivated. That is, the signal PG may be maintained to be logic low to activate the first PMOS transistor MP1. Because the pad PD is directly connected to the second node N2 via the second PMOS transistor MP2, the first PMOS transistor MP1 may cause the data bus 42 to have a logic high state via the pad PD. Additionally, the signal NG may be maintained to be logic low to deactivate the first NMOS transistor MN1. In this manner, the pad PD may have a logic high state.

On the other hand, when the data signal DQ is '0', the first PMOS transistor MP1 and the second NMOS transistor MN2 may be deactivated, and the first NMOS transistor MN1 may be activated. That is, the signal PG may be maintained to be logic high to deactivate the first PMOS transistor MP1. Additionally, the signal NG may be maintained to be logic high to activate the first NMOS transistor MN1. Accordingly, the pad PD may have a logic low state.

The driver 26 may cause the data bus 42 to have a logic high state via the second NMOS transistor MN2. In this manner, the memory controller 10 including the driver 26 in a sixth exemplary embodiment in accordance with principles of inventive concepts may control the memory device 30 supporting the LPDDR4 transmission method.

FIG. 7C is a table illustrating an operation of the driver 26 of FIG. 7A supporting the LPDDR4 transmission method.

Referring to FIGS. 7A and 7C, the memory controller 10 may maintain the signal LP to be logic high to support the LPDDR4 transmission method. Additionally, because the power supply voltage VDDQ is applied to the gate of the second NMOS transistor MN2, the second NMOS transistor MN2 always remains activated.

When a data signal DQ is '1', the first PMOS transistor MP1 may be activated, and the first NMOS transistor MN1 may be deactivated. That is, the signal PG may be maintained to be logic low to activate the first PMOS transistor MP1. Because the pad PD is connected directly to the second node N2 via the second PMOS transistor MP2, the first PMOS transistor MP1 may cause the data bus 42 to have a logic high state via the pad PD. Additionally, the signal NG may be maintained to be logic low to deactivate the first NMOS transistor MN1. Accordingly, the pad PD may have a logic high state.

On the other hand, when the data signal DQ is '0', the first PMOS transistor MP1 and the second NMOS transistor MN2 may be deactivated, and the first NMOS transistor MN1 may be activated. That is, the signal PG may be maintained to be logic high to deactivate the first PMOS transistor MP1. Additionally, the signal PG may be maintained to be logic high to activate the first NMOS transistor MN1. Accordingly, the pad PD may have a logic low state.

The driver 26 may cause the data bus 42 to have a logic high state via the first PMOS transistor MP1. Accordingly, the memory controller 10 including the driver 26 in a sixth exemplary embodiment in accordance with principles of inventive concepts may control the memory device 30 supporting the LPDDR3 transmission method.

Figures 8A, 8B, 8C:
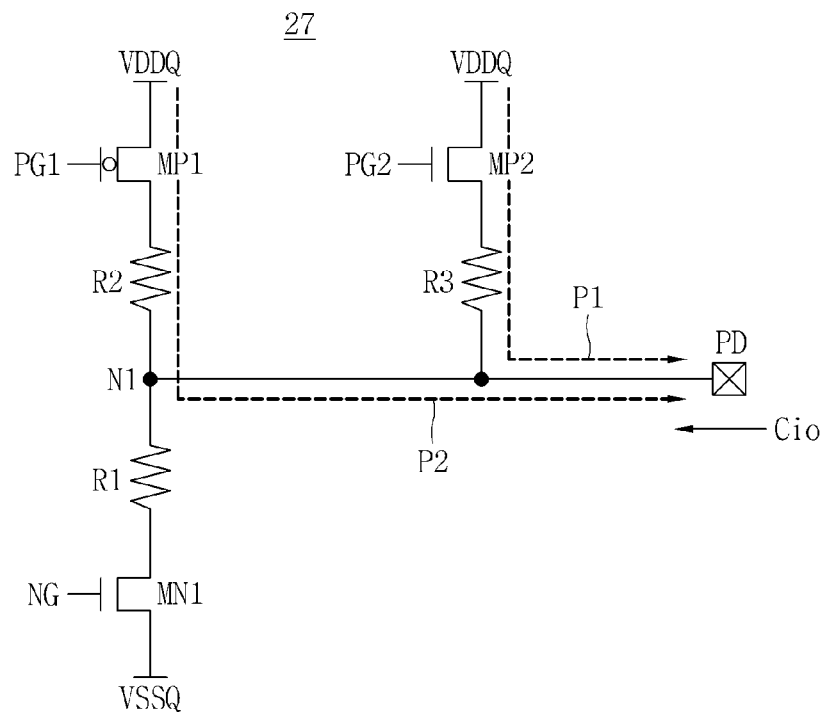
FIG. 8A is a circuit diagram of a conventional driver.
FIG. 8B is a table illustrating an operation of the driver of FIG. 8A which supports the LPDDR3 transmission method.
FIG. 8C is a table illustrating an operation of the driver of FIG. 8A which supports the LPDDR4 transmission method.

FIG. 8A is a circuit diagram of a conventional driver 27.

Referring to FIG. 8A, the driver 27 may include a first NMOS transistor MN1 connected between a ground voltage VSSQ source and a first node N1 and controlled by a signal NG, a PMOS transistor MP1 connected between the first node N1 and a power supply voltage VDDQ source and controlled by a signal PG1, and a second NMOS transistor MN2 connected between the first node N1 and the power supply voltage VDDQ source and controlled by a signal PG2. A pad PD may be connected to the first node N1. The PG1 signal and the signal PG2 may be independent of each other.

The driver 27 may further include a first resistor R1 connected between the first NMOS transistor MN1 and the first node N1, a second resistor R2 connected between the first node N1 and the PMOS transistor MP1, and a third resistor R3 connected between the first node N1 and the second NMOS transistor MN2.

The driver 27 may support the LPDDR3 transmission method using the first NMOS transistor MN1 and the PMOS transistor MP1. The driver 27 may also support the LPDDR4 transmission method using the first NMOS transistor MN1 and the second NMOS transistor MN2.

FIG. 8B is a table illustrating an operation of the driver 27 of FIG. 8A supporting the LPDDR3 transmission method.

Referring to FIGS. 8A and 8B, the second NMOS transistor MN2 may remain (to be) deactivated so that the driver 27 may support the LPDDR3 transmission method.

When a data signal DQ is '1', the PMOS transistor MP1 which is a pull-up transistor, may be activated, and the first NMOS transistor MN1 which is a pull-down transistor, may be deactivated. The signal PG may be maintained to be logic low to activate the PMOS transistor MP1. Additionally, the signal NG may be maintained to be logic low to deactivate the first NMOS transistor MN1. The PMOS transistor MP1 may cause the data bus 42 to have a logic high state via the pad PD. That is, the power supply voltage VDDQ may be applied to the pad PD in a second path P2. Accordingly, the pad PD may have a logic high state.

On the other hand, when the data signal DQ is '0', the PMOS transistor MP1 which is a pull-up transistor, may be deactivated, and the first NMOS transistor MN1 which is a pull-down transistor, may be activated. That is, the signal PG may be maintained to be logic high to deactivate the PMOS transistor MP1. Additionally, the signal Ng may be maintained to be logic high to activate the first NMOS transistor MN1. Accordingly, the pad PD may have a logic low state.

The first NMOS transistor MN1 may cause the data bus 42 to have a logic low state via the pad PD. The driver 27 may be connected to the memory device 30 supporting the LPDDR3 transmission method.

FIG. 8C is a table illustrating an operation of the driver 27 of FIG. 8A supporting the LPDDR4 transmission method.

Referring to FIGS. 8A and 8C, the PMOS transistor MP1 may remain deactivated so that the driver 27 may support the LPDDR4 transmission method.

When a data signal DQ is '1', the second NMOS transistor MN2 which is a pull-up transistor, may be activated, and the first NMOS transistor MN1 which is a pull-down transistor, may be deactivated. The signal PG2 may be maintained to be logic high to activate the second NMOS transistor MN2. Additionally, the signal NG may be maintained to be logic low to deactivate the first NMOS transistor MN1. The second NMOS transistor MN2 may cause the data bus 42 to have a logic high state via the pad PD. That is, the power supply voltage VDDQ may be applied to the pad PD in a first path P1. Accordingly, the pad PD may have a logic high state.

On the other hand, when the data signal DQ is '0', the second NMOS transistor MN2 which is a pull-up transistor, may be deactivated, and the first NMOS transistor MN1 which is a pull-down transistor, may be activated. That is, the signal PG2 may be maintained to be logic low to deactivate the second NMOS transistor MN2. Additionally, the signal NG may be maintained to be logic high to activate the first NMOS transistor MN1. Accordingly, the pad PD may have a logic low state.

The second NMOS transistor MN2 may cause the data bus 42 to have a logic low state via the pad PD. The driver 27 may be connected to the memory device 30 supporting the LPDDR4 transmission method.

Additionally, the driver 27 may output the power supply voltage VDDQ via the PMOS transistor MP1 or the second NMOS transistor MN2. In other words, the driver 27 may be modeled as two capacitors connected in parallel. As a result, the driver 27 may have a higher input capacitance Cio than those of the drivers 21 to 26 of FIGS. 4A to 7A.

Figure 9:
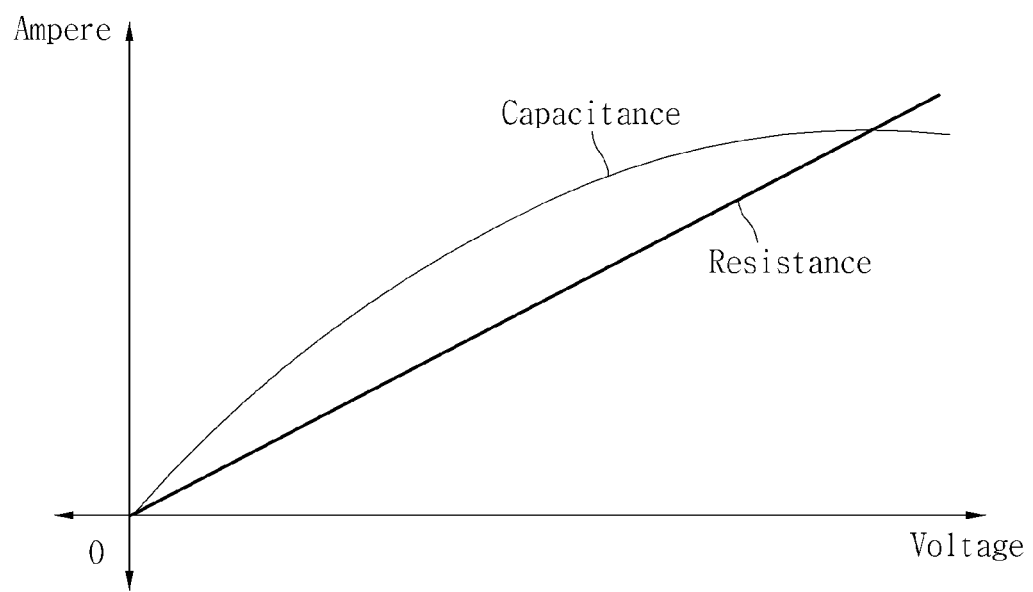
FIG. 9 is a graph illustrating linearity of an impedance.

FIG. 9 is a graph illustrating linearity of impedance.

In the graph of FIG. 9, the X-axis denotes a voltage and the Y-axis denotes an ampere (current).

If an amount of current regularly increases when a voltage increases, a resistor has a regular value. That is, the resistor has linearity. In contrast, when a voltage is applied to a capacitor, the amount of current increases to a large extent at a low voltage, and increases to a small extent at a high voltage. That is, the capacitor does not have linearity.

As a result, when a sufficiently high resistor is added to the drivers 21 to 26 in accordance with the first to sixth embodiments of the inventive concept, the impedances of the drivers 21 to 26 may have linearity. Embodiments in which a resistor is added to the drivers 21 to 26, will be described in greater detail with reference to FIGS. 10A to 15C below.

Figure 10A:
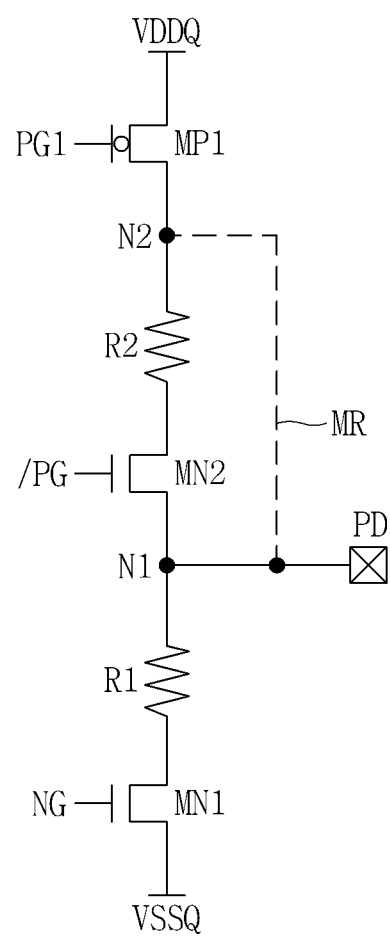
FIGS. 10A to 10C are circuit diagrams of modified examples of the driver of FIG. 4A.
Figure 10B:
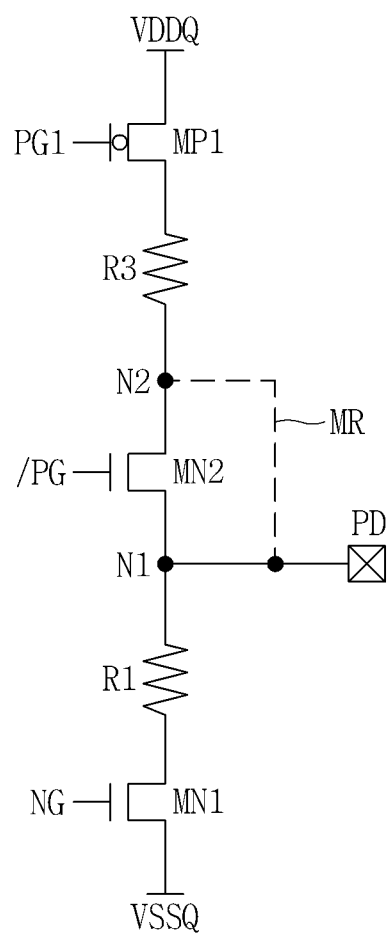
Figure 10C:
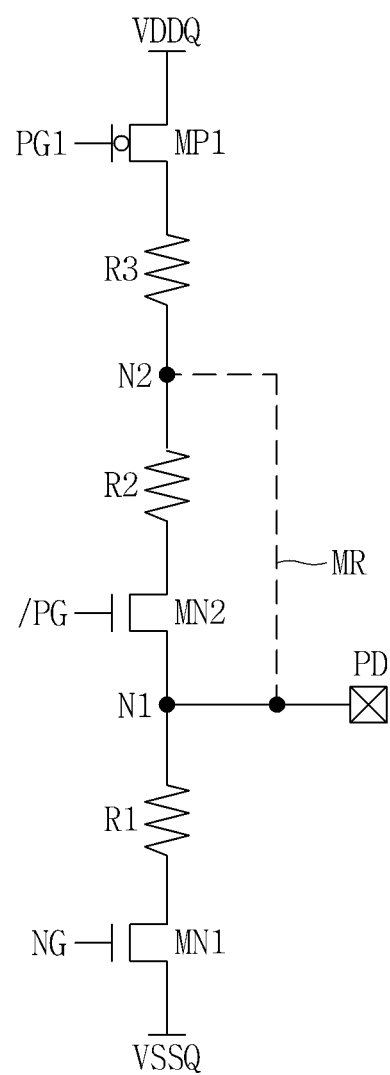

FIGS. 10A to 10C are circuit diagrams of modified exemplary embodiments of drivers in accordance with principles of inventive concepts, such as driver 21 of FIG. 4A.

Referring to FIG. 10A, a driver 21a may include a first NMOS transistor MN1 connected between a ground voltage VSSQ source and a first node N1 and controlled by a signal NG, a second NMOS transistor MN2 connected between the first node N1 and a second node N2 and controlled by a signal /PG, and a PMOS transistor MP1 connected between the second node N2 and a power supply voltage VDDQ source and controlled by a signal PG. The PG signal may have a phase opposite to that of the signal /PG, The driver 21a may further include a first resistor R1 connected between the first NMOS transistor MN1 and the first node N1, and a second resistor R2 connected between the second NMOS transistor MN2 and the second node N2.

A pad PD may be connected to the first node N1. When a metal revision MR is applied to the driver 21a in accordance with principles of inventive concepts, the pad PD may also be connected to the second node N2 using the metal revision MR.

When data is '0', a ground voltage VSSQ may be applied to the pad PD via the first resistor R1. When the data is '1', a power supply voltage VDDQ may be applied to the pad PD via the second resistor R2.

The first and second resistors R1 and R2 may increase the linearity of an impedance of the driver 21a. In this manner, when the metal revision MR is not applied to the driver 21a, the driver 21a may have linear characteristics when the LPDDR4 transmission method is supported.

Referring to FIG. 10B, a driver 21b may include a first NMOS transistor MN1 connected between a ground voltage VSSQ source and a first node N1 and controlled by a signal NG signal, a second NMOS transistor MN2 connected between the first node N1 and a second node N2 and controlled by a signal /PG, and a PMOS transistor MP1 connected between the second node N2 and a power supply voltage VDDQ source and controlled by a signal PG. The PG signal may have a phase opposite to that of the signal /PG.

The driver 21b may further include a first resistor R1 connected between the first NMOS transistor MN1 and the first node N1, and a third resistor R3 connected between the second node N2 and the PMOS transistor MP1.

A pad PD may be connected to the first node N1. When a metal revision MR is applied to the driver 21b in accordance with principles of inventive concepts, the pad PD may also be connected to the second node N2 using the metal revision MR.

When data is '0', a ground voltage VSSQ may be applied to the pad PD via the first resistor R1. When the data is '1', a power supply voltage VDDQ may be applied to the pad PD via the third resistor R3.

The first and third resistors R1 and R3 may increase the linearity of an impedance of the driver 21b. In this manner, when the metal revision MR is applied to the driver 21b, the driver 21b may have linear characteristics when the LPDDR3 transmission method is supported.

Referring to FIG. 10C, the driver 21c in accordance with principles of inventive concepts may include a first NMOS transistor MN1 connected between a ground voltage VSSQ source and a first node N1 and controlled by a signal NG, a second NMOS transistor MN2 connected between the first node N1 and a second node N2 and controlled by a signal /PG, and a PMOS transistor MP1 connected between the second node N2 and a power supply voltage VDDQ source. The PG signal may have a phase opposite to that of the signal /PG.

The driver 21c may further include a first resistor R1 connected between the first NMOS transistor MN1 and the first node N1, a second resistor R2 connected between the second NMOS transistor MN2 and the second node N2, and a third resistor R3 connected between the second node N2 and the PMOS transistor MP1, A pad PD may be connected to the first node N1. When a metal revision MR is applied to the driver 21a, the pad PD may also be connected to the second node N2 using the metal revision MR.

The first to third resistors R1 to R3 may increase the linearity of an impedance of the driver 21c. Specifically, when the metal revision is applied to the driver 21c, the driver 21c may have linear characteristics when the LPDDR3 transmission method is supported. When the metal revision is not applied to the driver 21c, the driver 21c may have linear characteristics when the LPDDR4 transmission method is supported.

The driver 21c including the first to third resistors R1 to R3 may have a larger chip size than that of the driver 21a including the first and second resistors R1 and R2, or that of the driver 21 including the first and third resistors R1 and R3.

Figure 11A:
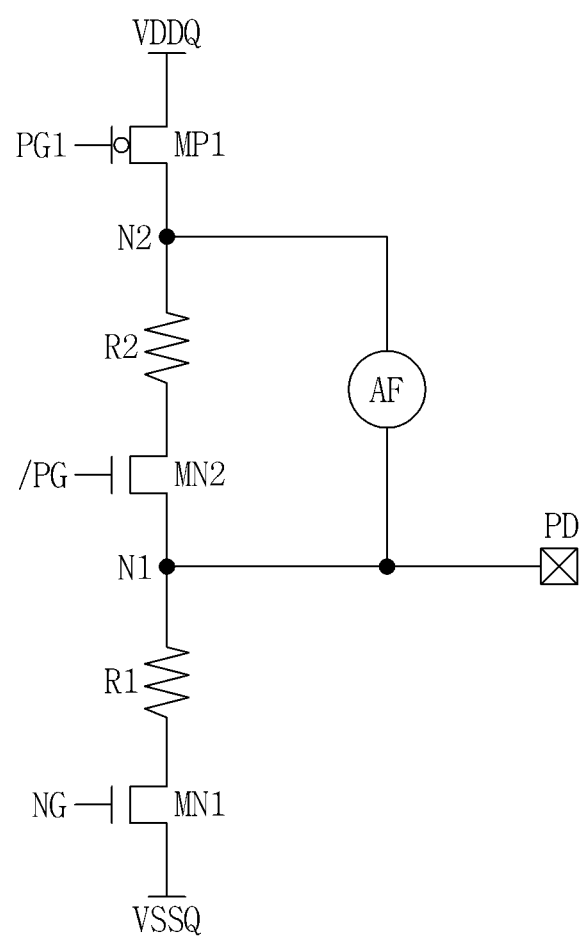
FIGS. 11A to 11C are circuit diagrams of modified examples of the driver of FIG. 4E.
Figure 11B:
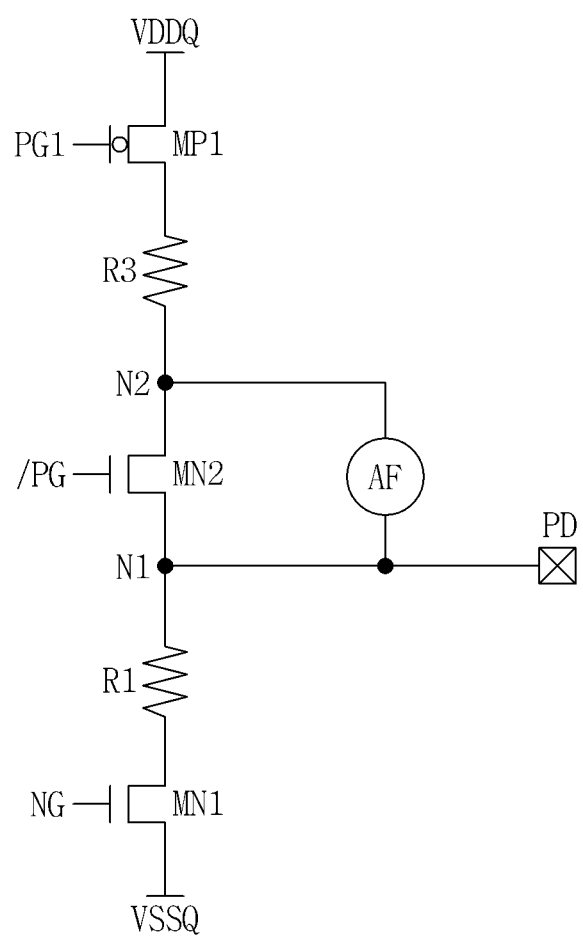
Figure 11C:
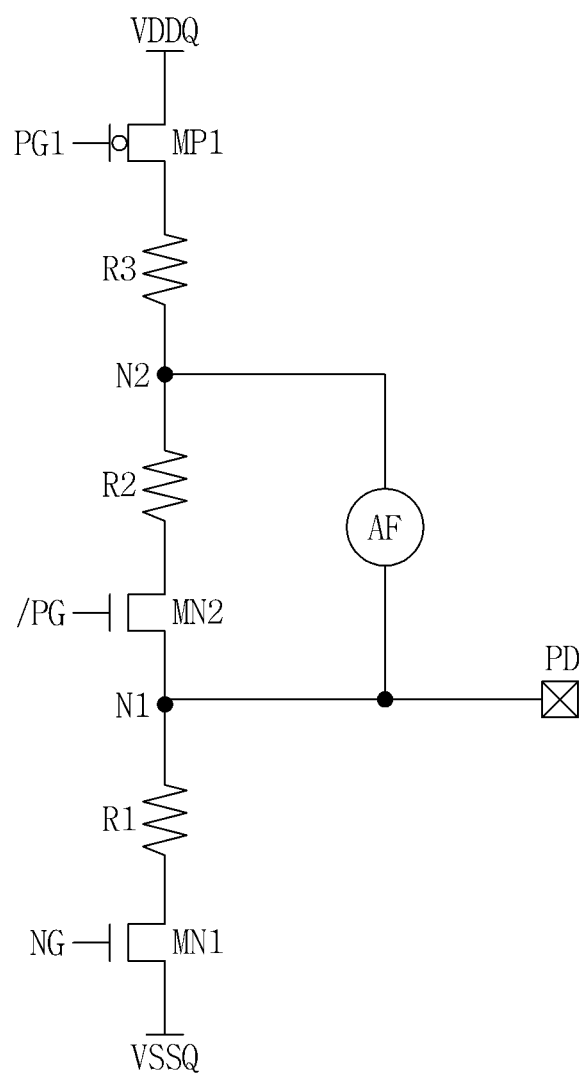

FIGS. 11A to 11C are circuit diagrams of exemplary embodiments of modified drivers in accordance with principles of inventive concepts, such as driver 22 of FIG. 4E.

Referring to FIG. 11A, a driver 22a may include a first NMOS transistor MN1 connected between a ground voltage VSSQ source and a first node N1 and controlled by a signal NG, a second NMOS transistor MN2 connected between the first node N1 and a second node N2 and controlled by a signal /PG, and a PMOS transistor MP1 connected between the second node N2 and a power supply voltage VDDQ source and controlled by a signal PG. The signal PG may have a phase opposite to that of the signal /PG.

The driver 22a may further include a first resistor R1 connected between the first NMOS transistor MN1 and the first node N1, and a second resistor R2 connected between the second NMOS transistor MN2 and the second node N2.

A pad PD may be connected to the first node N1, and may also be connected to the second node N2 via an anti-fuse AF.

When data is '0', a ground voltage VSSQ may be applied to the pad PD via the first resistor R1. When the data is '1', a power supply voltage VDDQ may be applied to the pad PD via the second resistor R2.

The first and second resistors R1 and R2 may increase the linearity of an impedance of the driver 22a. In this manner, when the anti-fuse AF is not fused, the driver 22a may have linear characteristics when the LPDDR4 transmission method is supported.

Referring to FIG. 11B, a driver 22b may include a first NMOS transistor MN1 connected between a ground voltage VSSQ source and a first node N1 and controlled by a signal NG, a second NMOS transistor MN2 connected between the first node N1 and a second node N2 and controlled by a signal /PG, and a PMOS transistor MP1 connected between the second node N2 and a power supply voltage VDDQ source and controlled by a signal PG. The PG signal may have a phase opposite to that of the signal /PG.

The driver 22b may further include a first resistor R1 connected between the first NMOS transistor MN1 and the first node N1, and a third resistor R3 connected between the second node N2 and the PMOS transistor MP1.

A pad PD may be connected to the first node N1. When an anti-fuse AF is fused, the pad PD may be connected to the second node N2 via the anti-fuse AF.

When data is '0', a ground voltage VSSQ may be applied to the pad PD via the first resistor R1 When the data is '1', a power supply voltage VDDQ may be applied to the pad PD via the third resistor R3.

The first and third resistors R1 and R3 may increase the linearity of an impedance of the driver 22b. In this manner, when the anti-fuse AF is fused, the driver 22b may have linear characteristics when the LPDDR3 transmission method is supported.

Referring to FIG. 11C, a driver 22c may include a first NMOS transistor MN1 connected between a ground voltage VSSQ source and a first node N1 and controlled by a signal NG, a second NMOS transistor MN2 connected between the first node N1 and a second node N2 and controlled by a signal /PG, and a PMOS transistor MP1 connected between the second node N2 and a power supply voltage VDDQ source and controlled by a signal PG. The signal PG may have a phase opposite to that of the signal /PG.

The driver 22c may further include a first resistor R1 connected between the first NMOS transistor MN1 and the first node N1, a second resistor R2 connected between the second NMOS transistor MN2 and the second node N2, and a third resistor R3 connected between the second node N2 and the PMOS transistor MP1.

A pad PD may be connected to the first node N1, and may also be connected to the second node N2 via the anti-fuse AF when the anti-fuse AF is fused.

The first to third resistors R1 to R3 may increase the linearity of an impedance of the driver 22c. Specifically, if the anti-fuse AF is not fused, the driver 21c may have linear characteristics when the LPDDR3 transmission method is supported. If the anti-fuse AF is fused, the driver 21c may have linear characteristics when the LPDDR4 transmission method is supported.

The driver 22c including the first to third resistors R1 to R3 may have a larger chip size than that of the driver 22a including the first and second resistors R1 and R2, or that of the driver 22b including the first and third resistors R1 and R3.

Figure 12A:
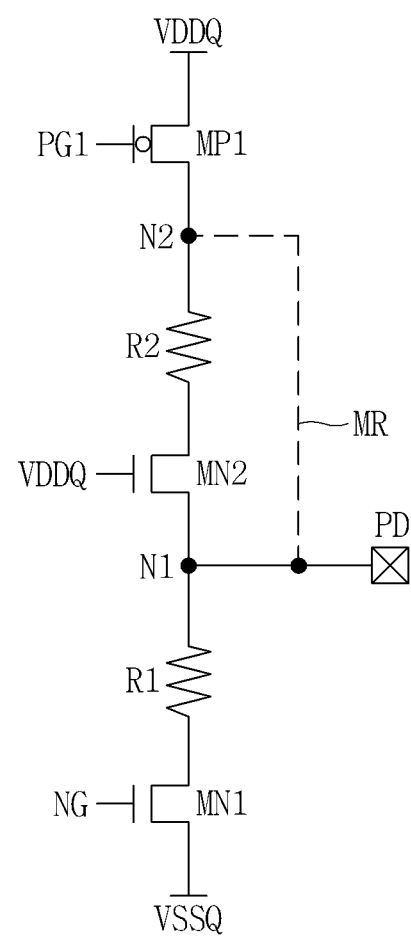
FIGS. 12A to 12C are circuit diagrams of modified examples of the driver of FIG. 5A.
Figure 12B:
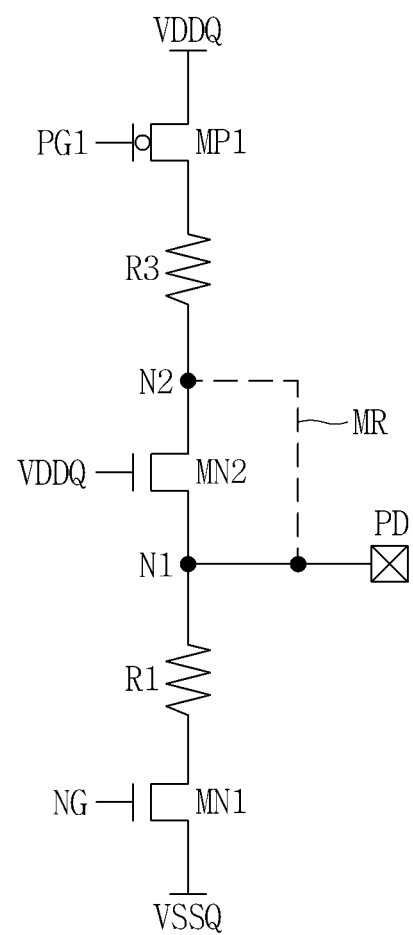
Figure 12C:
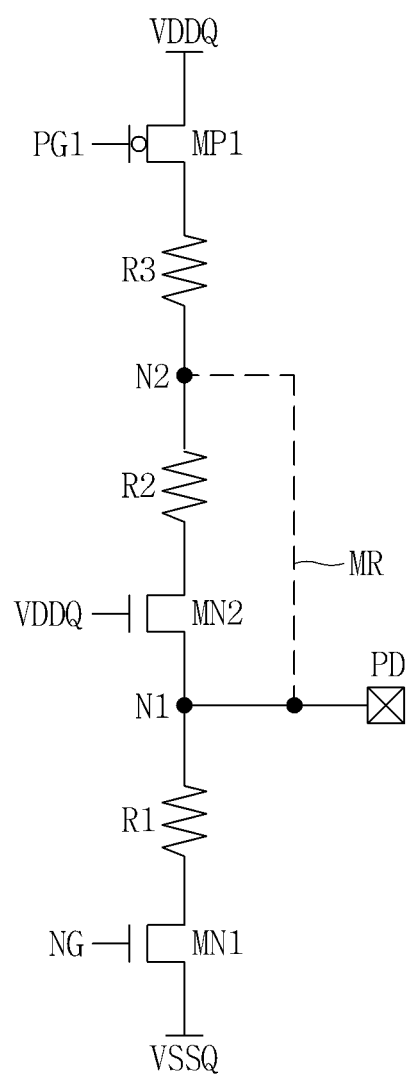

FIGS. 12A to 12C are circuit diagrams of modified examples of the driver 23 of FIG. 5A.

Referring to FIG. 12A, a driver 23a may include a first NMOS transistor MN1 connected between a ground voltage VSSQ source and a first node N1 and controlled by a signal NG signal, a second NMOS transistor MN2 connected between the first node N1 and a second node N2 and including a gate to which a power supply voltage VDDQ is applied, and a PMOS transistor MP1 connected between the second node N2 and a power supply voltage VDDQ source and controlled by a signal PG.

The driver 23a may further include a first resistor R1 connected between the first NMOS transistor MN1 and the first node N1, and a second resistor R2 connected between the second NMOS transistor MN2 and the second node N2.

A pad PD may be connected to the first node N1, and may also be applied to the second node N2 via a metal revision MR when the metal revision MR is applied to the driver 23a.

When data is '0', a ground voltage VSSQ may be applied to the pad PD via the first resistor R1. When the data is '1', a power supply voltage VDDQ may be applied to the pad PD via the second resistor R2.

The first and second resistors R1 and R2 may increase the linearity of an impedance of the driver 23a. In this manner, when the metal revision MR is not applied to the driver 23a, the driver 23a may have linear characteristics when the LPDDR4 transmission method is supported.

Referring to FIG. 12B, a driver 23b may include a first NMOS transistor MN1 connected between a ground voltage VSSQ source and a first node N1 and controlled by a signal NG, a second NMOS transistor MN2 connected between the first node N1 and a second node N2 and including a gate to which a power supply voltage VDDQ is applied, and a PMOS transistor MP1 connected between the second node N2 and a power supply voltage VDDQ source and controlled by a signal PG.

The driver 23b may further include a first resistor R1 connected between the first NMOS transistor MN1 and the first node N1, and a third resistor R3 connected between the second node N2 and the PMOS transistor MP1.

A pad PD may be connected to the first node N1, and may also be connected to the second node N2 via a metal revision MR when the metal revision MR is applied to the driver 23b.

When data is '0', a ground voltage VSSQ may be applied to the pad PD via the first resistor R1. When the data is '1', a power supply voltage VDDQ may be applied to the pad PD via the third resistor R3.

The first and third resistors R1 and R3 may increase the linearity of an impedance of the driver 23b. In this manner, when the metal revision MR is applied to the driver 23b, the driver 23b may have linear characteristics when the LPDDR3 transmission method is supported.

Referring to FIG. 12C, a driver 23c may include a first NMOS transistor MN1 connected between a ground voltage VSSQ source and a first node N1 and controlled by a signal NG signal, a second NMOS transistor MN2 connected between the first node N1 and a second node N2 and including a gate to which a power supply voltage VDDQ is applied, and a PMOS transistor MP1 connected between the second node N2 and a power supply voltage VDDQ source and controlled by a signal PG.

The driver 23c may further include a first resistor R1 connected between the first NMOS transistor MN1 and the first node N1, a second resistor R2 connected between the second NMOS transistor MN2 and the second node N2, and a third resistor R3 connected between the second node N2 and the PMOS transistor MP1.

A pad PD may be connected to the first node N1, and may also be connected to the second node N2 using the metal revision MR when the metal revision MR is applied to the driver 23a.

The first to third resistors R1 to R3 may increase the linearity of an impedance of the driver 23c. Specifically, if the metal revision MR is applied to the driver 23c, the driver 23c may have linear characteristics when the LPDDR3 transmission method is applied. If the metal revision MR is not applied to the driver 23c, the driver 23c may have linear characteristics when the LPDDR4 transmission method is applied.

The driver 23c including the first to third resistors R1 to R3 may have a larger chip size than that of the driver 23a including the first and second resistors R1 and R2, or that of the driver 23b including the first and third resistors R1 and R3.

Figure 13A:
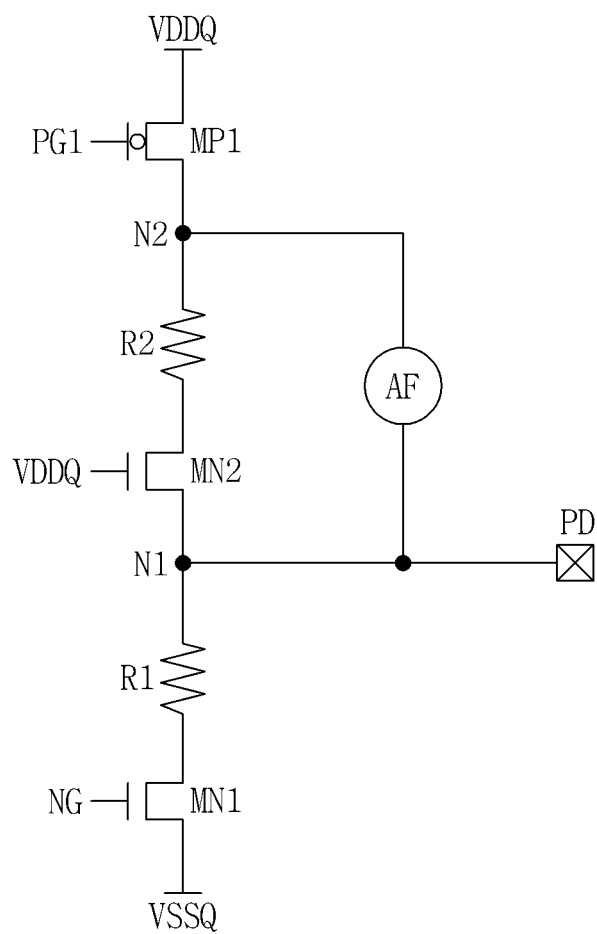
FIGS. 13A to 13C are circuit diagrams of modified examples of the driver of FIG. 5E.
Figure 13B:
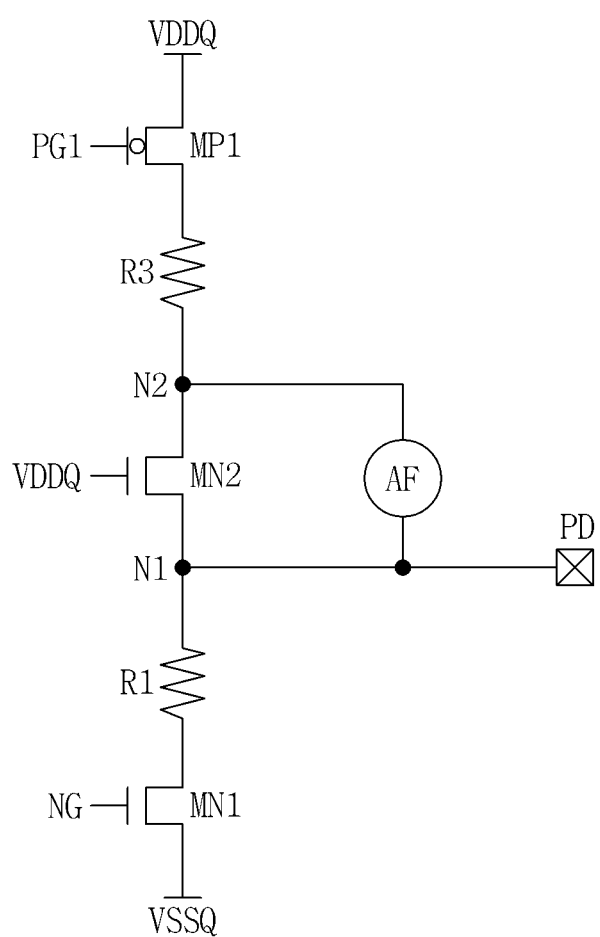
Figure 13C:
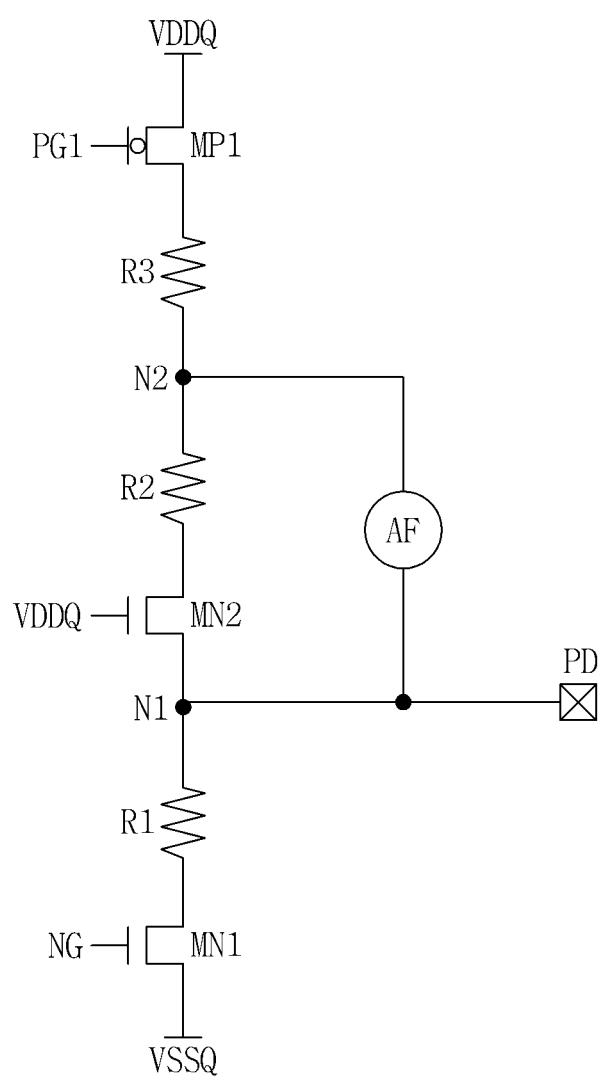

FIGS. 13A to 13C are circuit diagrams of exemplary embodiments of drivers in accordance with principles of inventive concepts such as modified examples of the driver 24 of FIG. 5E.

Referring to FIG. 13A, a driver 24a may include a first NMOS transistor MN1 connected between a ground voltage VSSQ source and a first node N1 and controlled by a signal NQ a second NMOS transistor MN2 connected between the first node N1 and a second node N2 and including a gate to which a power supply voltage VDDQ is applied, and a PMOS transistor MP1 connected between the second node N2 and a power supply voltage VDDQ source and controlled by a signal PG.

In accordance with principles of inventive concepts, driver 24a may further include a first resistor R1 connected between the first NMOS transistor MN1 and the first node N1, and a second resistor R2 connected between the second NMOS transistor MN2 and the second node N2.

A pad PD may be connected to the first node N1, and may also be connected to the second node N2 via an anti-fuse AF.

When data is '0', a ground voltage VSSQ may be applied to the pad PD via the first resistor R1. When data is '1', a power supply voltage VDDQ may be applied to the pad PD via the second resistor R2.

The first and second resistors R1 and R2 may increase the linearity of an impedance of the driver 24a. Accordingly, when the anti-fuse AF is not fused, the driver 24a may have linear characteristics when the LPDDR4 transmission method is supported.

Referring to FIG. 13B, a driver 24b may include a first NMOS transistor MN1 connected between a ground voltage VSSQ source and a first node N1 and controlled by a signal NG, a second NMOS transistor MN2 connected between the first node N1 and a second node N2 and including a gate to which a power supply voltage VDDQ is applied, and a PMOS transistor MP1 connected between the second node N2 and a power supply voltage VDDQ source and controlled by a signal PG.

The driver 24b may further include a first resistor R1 connected between the first NMOS transistor MN1 and the first node N1, and a third resistor R3 connected between the second node N2 and the PMOS transistor MP1.

When data is '0', a ground voltage VSSQ may be applied to the pad PD via the first resistor R1. When data is '1', a power supply voltage VDDQ may be applied to the pad PD via the third resistor R3.

A pad PD may be connected to the first node N1, and may also be connected to the second node N2 via an anti-fuse AF when the anti-fuse AF is fused.

The first and third resistors R1 and R3 may increase the linearity of an impedance of the driver 24b. Accordingly, if the anti-fuse AF is fused, the driver 24b may have linear characteristics when the LPDDR3 transmission method is supported.

Referring to FIG. 13C, a driver 24c may include a first NMOS transistor MN1 connected between a ground voltage VSSQ source and a first node N1 and controlled by a signal NG, a second NMOS transistor MN2 connected between the first node N1 and a second node N2 and including a gate to which a power supply voltage VDDQ is applied, and a PMOS transistor MP1 connected between the second node N2 and a power supply voltage VDDQ source and controlled by a signal PG.

The driver 24c may further include a first resistor R1 connected between the first NMOS transistor MN1 and the first node N1, a second resistor R2 connected between the second NMOS transistor MN2 and the second node N2, and a third resistor R3 connected between the second node N2 and the PMOS transistor MP1.

A pad PD may be connected to the first node N1, and may also be connected to the second node N2 via an anti-fuse AF when the anti-fuse AF is fused.

The first to third resistors R1 to R3 may increase the linearity of an impedance of the driver 24c. Specifically, if the anti-fuse AF is not fused, the driver 24c may have linear characteristics when the LPDDR3 transmission method is supported. If the anti-fuse AF is fused, the driver 24c may have linear characteristics when the LPDDR4 transmission method is supported.

The driver 24c including the first to third resistors R1 to R3 may have a larger chip size than that of the driver 24a including the first and second resistors R1 and R2, or that of the driver 24b including the first and third resistors R1 and R3.

Figure 14A:
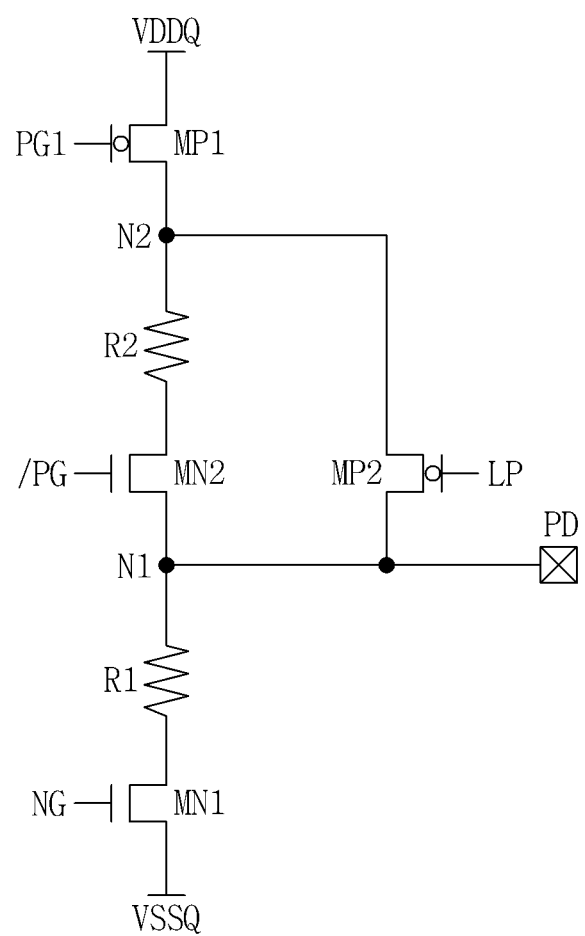
FIGS. 14A to 14C are circuit diagrams of modified examples of the driver of FIG. 6A.
Figure 14B:
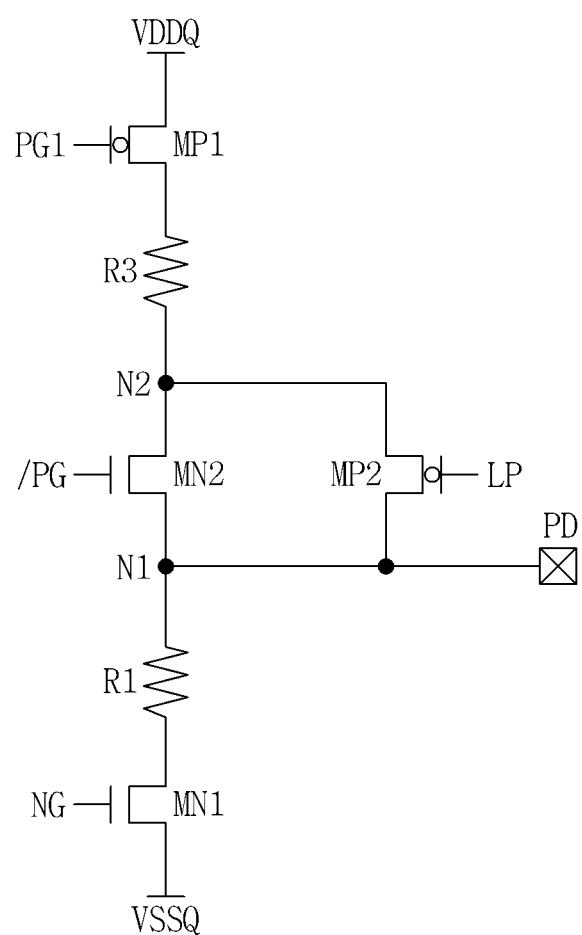
Figure 14C:
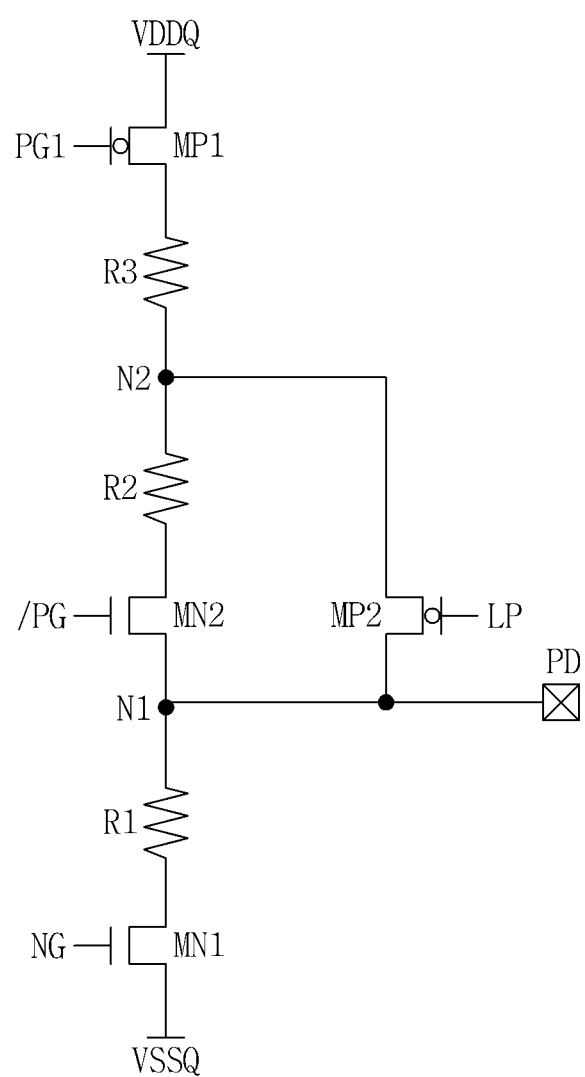

FIGS. 14A to 14C are circuit diagrams of exemplary embodiments of drivers in accordance with principles of inventive concepts such as modified examples of the driver 25 of FIG. 6A.

Referring to FIG. 14A, a driver 25a may include a first NMOS transistor MN1 connected between a ground voltage VSSQ source and a first node N1 and controlled by a signal NG, a second NMOS transistor MN2 connected between the first node N1 and a second node N2 and controlled by a signal /PG, a first PMOS transistor MP1 connected between the second node N2 and a power supply voltage VDDQ source and controlled by a signal PG, and a second PMOS transistor MP2 connected between the first node N1 and the second node N2 and controlled by a signal LP.

The driver 25a may further include a first resistor R1 connected between the first NMOS transistor MN1 and the first node N1, and a second resistor R2 connected between the second NMOS transistor MN2 and the second node N2.

A pad PD may be connected to the first node N1, and may also be connected to the second node N2 via the second PMOS transistor MP2 when the signal LP is logic low.

When data is '0', a ground voltage VSSQ may be applied to the pad PD via the first resistor R1. When the data is '1', a power supply voltage VDDQ may be applied to the pad PD via the second resistor R2.

The first and second resistors R1 and R2 may increase the linearity of an impedance of the driver 25a. In this manner, if the signal LP is logic high, the driver 25a may have linear characteristics when the LPDDR4 transmission method is supported.

Referring to FIG. 14B, a driver 25b may include a first NMOS transistor MN1 connected between a ground voltage VSSQ source and a first node N1 and controlled by a signal NG, a second NMOS transistor MN2 connected between the first node N1 and a second node N2 and controlled by a signal /PG, a first PMOS transistor MP1 connected between the second node N2 and a power supply voltage VDDQ source and controlled by a signal PG, and a second PMOS transistor MP2 connected between the first node N1 and the second node N2 and controlled by a signal LP. The PG signal may have a phase opposite to that of the signal /PG.

The driver 25b may further include a first resistor R1 connected between the first NMOS transistor MN1 and the first node N1, and the third resistor R3 connected between the second node N2 and the PMOS transistor MP1.

A pad PD may be connected to the first node N1, and may also be connected to the second node N2 via the second PMOS transistor MP2 when the signal LP is logic low.

When data is '0', a ground voltage VSSQ may be applied to the pad PD via the first resistor R1. When the data is '1', a power supply voltage VDDQ may be applied to the pad PD via the third resistor R3.

The first and third resistors R1 and R3 may increase the linearity of an impedance of the driver 25b. In this manner, if the signal LP is logic low, the driver 25b may have linear characteristics when the LPDDR3 transmission method is supported.

Referring to FIG. 14C, a driver 25c may include a first NMOS transistor MN1 connected between a ground voltage VSSQ source and a first node N1 and controlled by a signal NG, a second NMOS transistor MN2 connected between the first node N1 and a second node N2 and controlled by a signal /PG, a first PMOS transistor MP1 connected between the second node N2 and a power supply voltage VDDQ source and controlled by a signal PG, and a second PMOS transistor MP2 connected between the first node N1 and the second node N2 and controlled by a signal LP. The signal PG may have a phase opposite to that of the signal /PG.

The driver 25c may further include a first resistor R1 connected between the first NMOS transistor MN1 and the first node N1, a second resistor R2 connected between the second NMOS transistor MN2 and the second node N2, and a third resistor R3 connected between the second node N2 and the PMOS transistor MP1.

A pad PD may be connected to the first node N1, and may also be connected to the second node N2 via the second PMOS transistor MP2 when the signal LP is logic low.

The first to third resistors R1 to R3 may increase the linearity of an impedance of the driver 25c. Specifically, if the signal LP is logic high, the driver 25c may have linear characteristics when the LPDDR3 transmission method is supported. If the signal LP is logic low, the driver 25c may have linear characteristics when the LPDDR4 transmission method is supported.

The driver 25c including the first to third resistors R1 to R3 may have a larger chip size than that of the driver 25a including the first and second resistors R1 and R2, or that of the driver 25b including the first and third resistors R1 and R3.

Figure 15A:
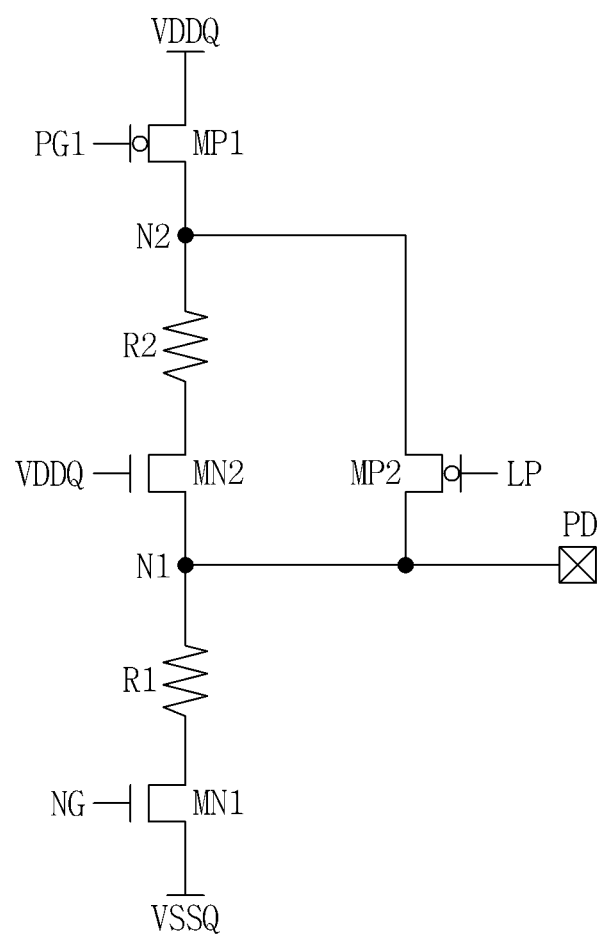
FIGS. 15A to 15C are circuit diagrams of modified examples of the driver of FIG. 7A.
Figure 15B:
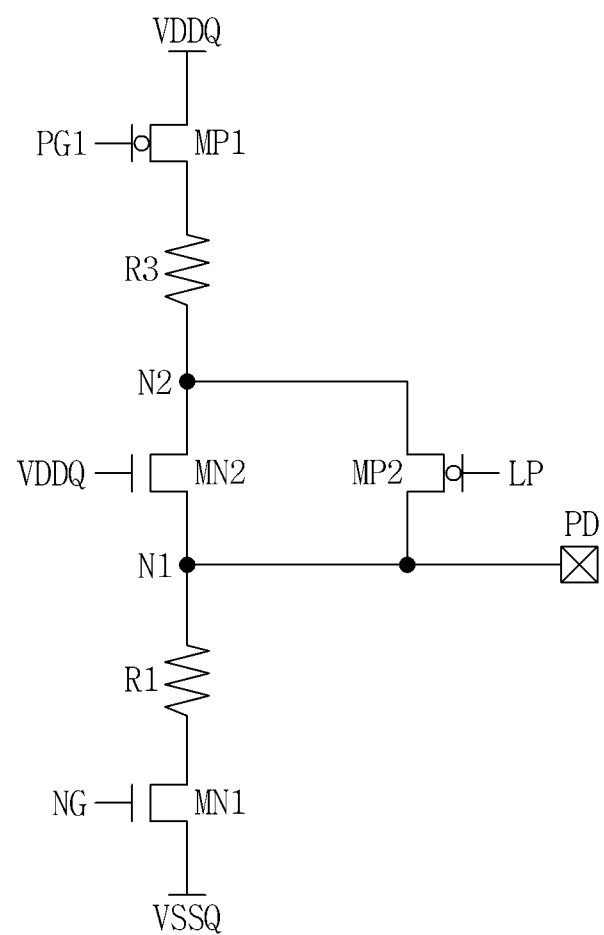
Figure 15C:
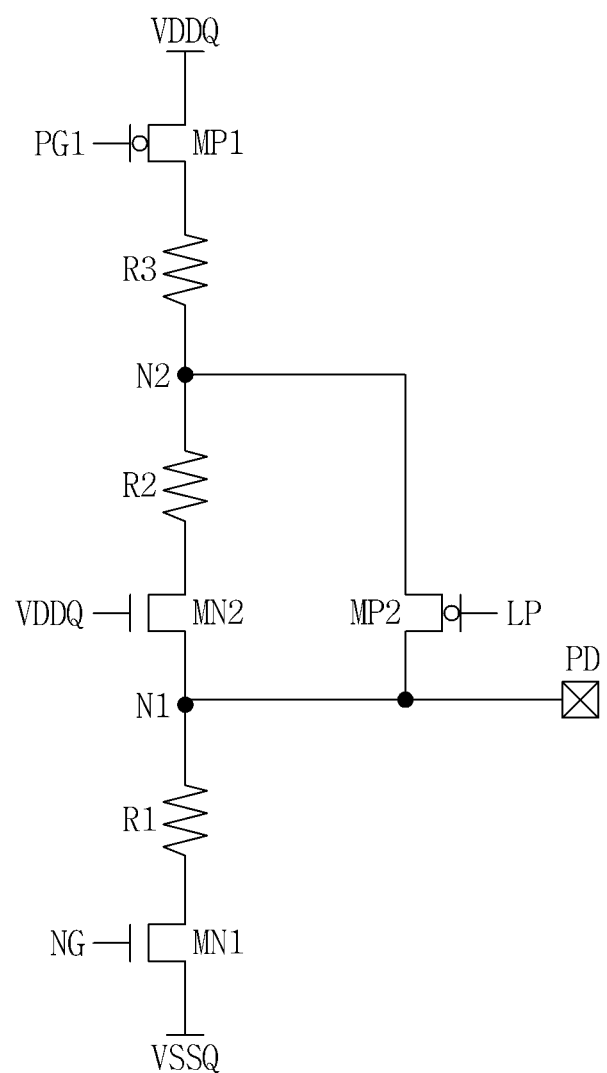

FIGS. 15A to 15C are circuit diagrams of exemplary embodiments of drivers in accordance with principles of inventive concepts such as modified examples of the driver 26 of FIG. 7A.

Referring to FIG. 15A, a driver 26a may include a first NMOS transistor MN1 connected between a ground voltage VSSQ source and a first node N1 and controlled by a signal NG, a second NMOS transistor MN2 connected between the first node N1 and a second node N2 and including a gate to which a power supply voltage VDDQ is applied, a first PMOS transistor MP1 connected between the second node N2 and a power supply voltage VDDQ source and controlled by a signal PG, and a second PMOS transistor MP2 connected between the first node N1 and the second node N2 and controlled by a signal LP.

The driver 26a may further include a first resistor R1 connected between the first NMOS transistor MN1 and the first node N1, and a second resistor R2 connected between the second NMOS transistor MN2 and the second node N2.

A pad PD may be connected to the first node N1, and may also be connected to the second node N2 via the second PMOS transistor MP2 when the signal LP is logic low.

When data is '0', a ground voltage VSSQ may be applied to the pad PD via the first resistor R1. When the data is '1', a power supply voltage VDDQ may be applied to the pad PD via the second resistor R2.

The first and second resistors R1 and R2 may increase the linearity of an impedance of the driver 26a. Accordingly, if the signal LP is logic high, the driver 26a may have linear characteristics when the LPDDR4 transmission method is supported.

Referring to FIG. 15B, a driver 26b may include a first NMOS transistor MN1 connected between a ground voltage VSSQ source and a first node N1 and controlled by a signal NG, a second NMOS transistor MN2 connected between the first node N1 and a second node N2 and including a gate to which a power supply voltage VDDQ is applied, a first PMOS transistor MP1 connected between the second node N2 and a power supply voltage VDDQ source and controlled by a signal PG, and a second PMOS transistor MP2 connected between the first node N1 and the second node N2 and controlled by a signal LP.

In accordance with principles of inventive concepts, driver 26b may further include a first resistor R1 connected between the first NMOS transistor MN1 and the first node N1, and a third resistor R3 connected between the second node N2 and the PMOS transistor MP1.

A pad PD may be connected to the first node N1, and may also be connected to the second node N2 via the second PMOS transistor MP2 when the signal LP is logic low.

When data is '0', a ground voltage VSSQ may be applied to the pad PD via the first resistor R1. When the data is '1', a power supply voltage VDDQ may be applied to the pad PD via the third resistor R3.

The first and third resistors R1 and R3 may increase the linearity of an impedance of the driver 26b. In this manner, if the signal LP is logic low, the driver 26b may have linear characteristics when the LPDDR3 transmission method is supported.

Referring to FIG. 15C, a driver 26c may include a first NMOS transistor MN1 connected between a ground voltage VSSQ source and a first node N1 and controlled by a signal NG, a second NMOS transistor MN2 connected between the first node N1 and a second node N2 and including a gate to which a power supply voltage VDDQ is applied, a first PMOS transistor MP1 connected between the second node N2 and a power supply voltage VDDQ source and controlled by a signal PG, and a second PMOS transistor MP2 connected between the first node N1 and the second node N2 and controlled by a signal LP.

In accordance with principles of inventive concepts, driver 26c may further include a first resistor R1 connected between the first NMOS transistor MN1 and the first node N1, a second resistor R2 connected between the second NMOS transistor MN2 and the second node N2, and a third resistor R3 connected between the second node N2 and the PMOS transistor MP1.

A pad PD may be connected to the first node N1, and may also be connected to the second node N2 via the second PMOS transistor MP2 when the signal LP is logic low.

The first to third resistors R1 to R3 may increase the linearity of an impedance of the driver 26c. Specifically, if the signal LP is logic high, the driver 26c may have linear characteristics when the LPDDR3 transmission method is supported. If the signal LP is logic low, the driver 26c may have linear characteristics when the LPDDR4 transmission method is supported.

The driver 26c including the first to third resistors R1 to R3 may have a larger chip size than that of the driver 26a including the first and second resistors R1 and R2, or that of the driver 26b including the first and third resistors R1 and R3.

Figure 16:
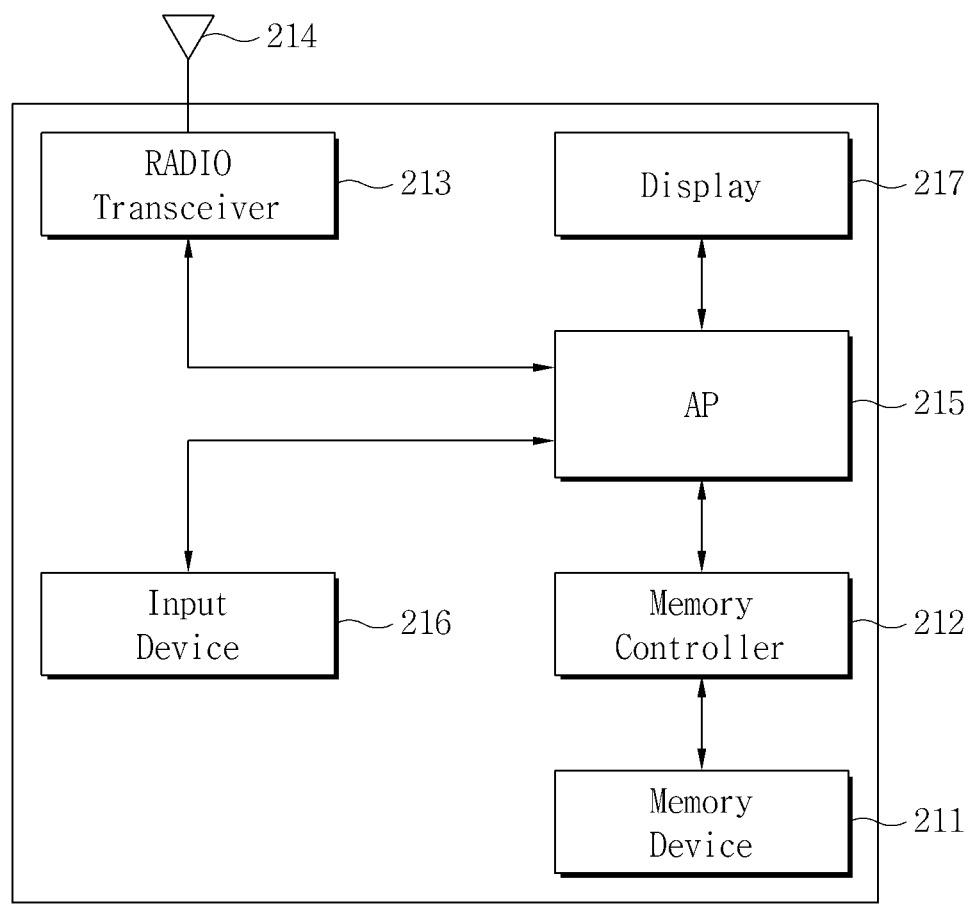
FIG. 16 is a block diagram of a computer system including a memory controller illustrated in FIG. 1 in accordance with principles of inventive concepts.

FIG. 16 is a block diagram of a computer system 210 in accordance with principles of inventive concepts including the memory controller 10 illustrated in FIG. 1 in accordance with principles of inventive concepts.

Referring to FIG. 16, the computer system 210 includes a memory device 211, a memory controller 212 configured to control the memory device 211, a radio transceiver 213, an antenna 214, an application processor 215, an input device 216, and a display unit 217.

The radio transceiver 213 may transmit or receive a radio signal via the antenna 214. For example, the radio transceiver 213 may transform a radio signal received via the antenna 214 into a signal to be processed by the application processor 215.

In this manner, the application processor 215 may process the signal received from the radio transceiver 213, and transmit the processed signal to the display unit 217. Additionally, the radio transceiver 213 may transform a signal received from the application processor 215 into a radio signal, and output the radio signal to an external device (not shown) via the antenna 214.

The input device 216 may be a device via which a control signal for controlling an operation of the application processor 215 or a signal that is to be processed by the application processor 215 may be input, and may be embodied as a pointing device such as touch pad and a computer mouse, a keypad, or a keyboard.

In accordance with principles of inventive concepts, the memory controller 212 configured to control operation of the memory device 211 may be embodied as a part of the application processor 215, or may be embodied as a chip installed separately from the application processor 215.

Additionally, the memory controller 212 may be embodied as the memory controller 10 of FIG. 1.

Figure 17:
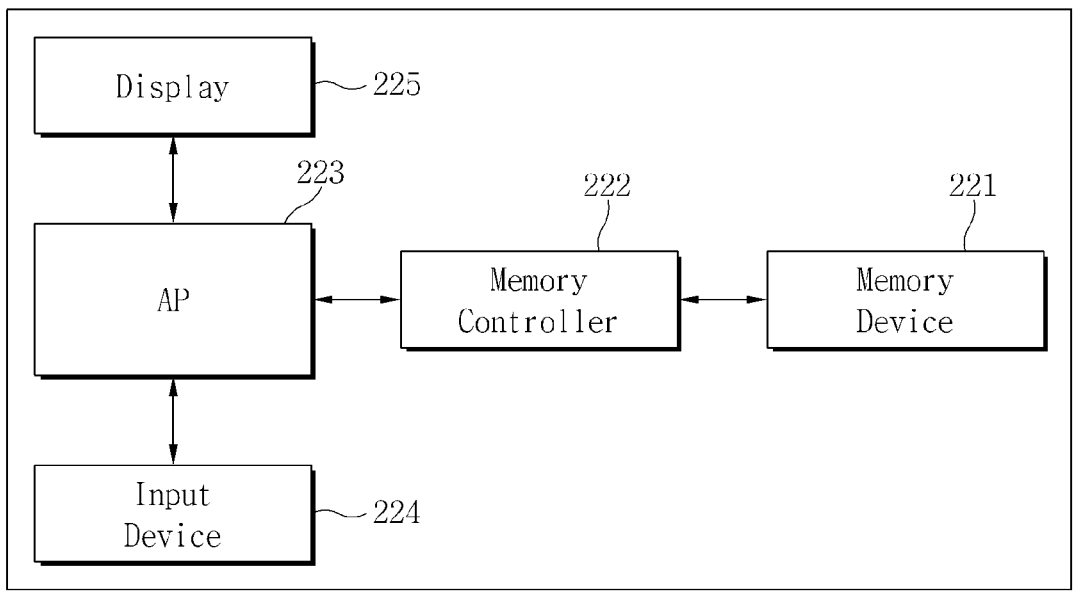
FIG. 17 is a block diagram of a computer system including a memory controller illustrated in FIG. 1 in accordance with another embodiment of the inventive concept.

FIG. 17 is a block diagram of a computer system 220 including a memory controller 10 illustrated in FIG. 1 in accordance with another exemplary embodiment in accordance with principles of inventive concepts.

Referring to FIG. 17, the computer system 220 may be embodied as a personal computer (PC), a network server, a tablet PC, a net-book, an e-reader, a personal digital assistant (PDA), a portable multimedia player (PMP), an MP3 player, or an MP4 player, for example.

In this exemplary embodiment computer system 220 includes a memory device 221, a memory controller 222 configured to control a data processing operation of the memory device 221, an application processor 223, an input device 224, and a display unit 225.

The application processor 223 may display data stored in the memory device 221 on the display unit 225, based on data input via the input device 224. For example, the input device 224 may be embodied as a pointing device such as touch pad and a computer mouse, a keypad, or a keyboard. The application processor 223 may control overall operations of the computer system 220, and may control an operation of the memory controller 222.

In accordance with principles of inventive concepts, the memory controller 222 configured to control operation of the memory device 221 may be embodied as a part of the application processor 223, or may be embodied as a chip installed separately from the application processor 223. That is, the memory controller 222 may be embodied as the memory controller 10 of FIG. 1.

Figure 18:
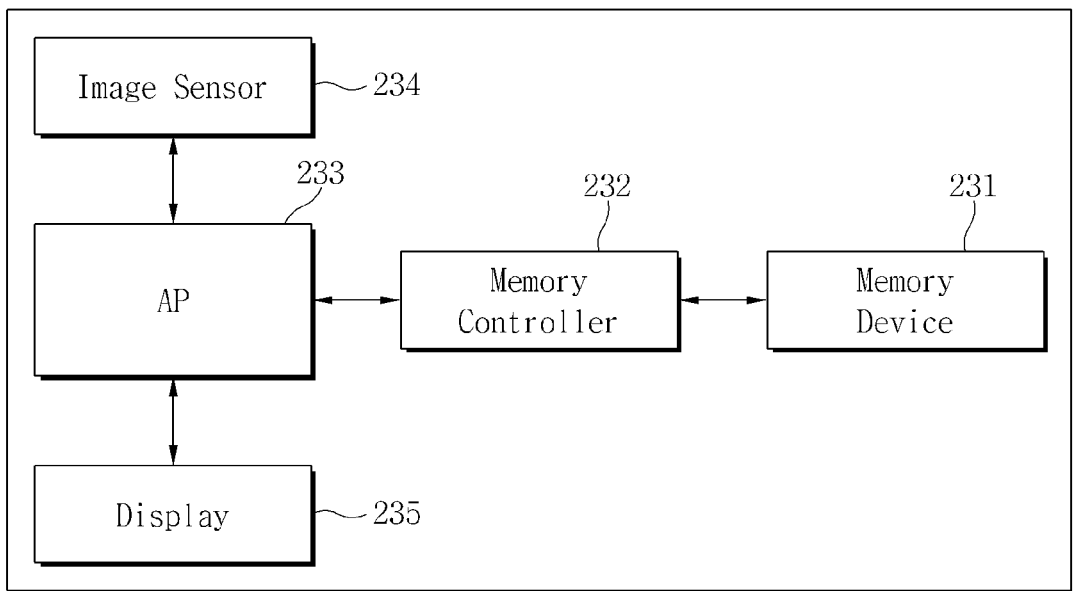
FIG. 18 is a block diagram of a computer system including a memory controller illustrated in FIG. 1 in accordance with another embodiment of the inventive concept.

FIG. 18 is a block diagram of a computer system 230 including a memory controller 10 illustrated in FIG. 1 in accordance with another exemplary embodiment in accordance with principles of inventive concepts.

Referring to FIG. 18, the computer system 230 may be embodied as an image processing device such as, for example, a digital camera or a mobile phone including a digital camera, a smart phone, or a tablet PC.

In exemplary embodiments in accordance with principles of inventive concepts, computer system 230 includes a memory device 231, and a memory controller 232 configured to control a data processing operation (for example, a write operation or a read operation) of the memory device 231. The computer system 230 may further include an application processor 233, an image sensor 234, and a display unit 235.

The image sensor 234 of the computer system 230 transforms an optical image into digital signals, and transmits the digital signals to the application processor 233 or the memory controller 232. Under control of the application processor 233, the digital signals may be displayed on the display unit 235, or may be stored in the memory device 231 via the memory controller 232.

Additionally, the data stored in the memory device 231 may be displayed on the display unit 235, under control of the application processor 233 or the memory controller 232.

In accordance with principles of inventive concepts, the memory controller 232 configured to control an operation of the memory device 231 may be embodied as a part of the application processor 233, or may be embodied as a chip installed separately from the application processor 233. That is, the memory controller 232 may be embodied as the memory controller 10 of FIG. 1.

A memory controller in accordance with principles of inventive concepts is capable of supporting both a semiconductor memory device employing an LPDDR3 transmission method and a semiconductor memory device employing an LPDDR4 transmission method.

The foregoing is illustrative of embodiments in accordance with principles of inventive concepts and is not to be construed as limiting thereof. Although a few exemplary embodiments have been described, those skilled in the art will readily appreciate that modifications are possible in embodiments without materially departing from the inventive concepts. Accordingly, all such modifications are intended to be included within the scope of inventive concepts as defined in the claims.

What is claimed is:

1. A bus line driver comprising:
a first NMOS transistor connected between a ground voltage source and a first node, and controlled by a first signal;
a second NMOS transistor connected between the first node and a second node, and controlled by a second signal;
a first PMOS transistor connected between the second node and a power supply voltage source, and controlled by a third signal; and
a pad connected to the first node,
wherein, when a first transmission method is supported and the first PMOS transistor is activated, the power supply voltage is applied to the pad via the second NMOS transistor, and
when a second transmission method is supported, the pad is connected to the second node.

2. The driver of claim 1, wherein the second and third signals have opposite phases.

3. The driver of claim 2, wherein, when the second transmission method is supported, the pad is connected to the second node using a metal revision, and
when the first PMOS transistor is activated, the power supply voltage is applied to the pad via the second node.

4. The driver of claim 2, wherein, when the second transmission method is supported, the pad is connected to the second node via an anti-fuse, and
when the first PMOS transistor is activated, the power supply voltage is applied to the pad via the second node.

5. The driver of claim 1, wherein the power supply voltage is applied to the second signal.

6. The driver of claim 5, wherein, when the second transmission method is supported, the pad is connected to the second node using a metal revision, and
when the first PMOS transistor is activated, the power supply voltage is applied to the pad via the second node.

7. The driver of claim 5, wherein, when the second transmission method is supported, the pad is connected to the second node via an anti-fuse, and
when the first PMOS transistor is activated, the power supply voltage is applied to the pad via the second node.

8. The driver of claim 1, further comprising a second PMOS transistor connected between the second node and the pad, and controlled by a fourth signal.

9. The driver of claim 8, wherein the second and third signals have opposite phases, and
the first or second transmission method is supported according to the fourth signal.

10. The driver of claim 8, wherein the power supply voltage is applied to the second signal, and
the first or second transmission method is supported according to the fourth signal.

11. The driver of claim 1, further comprising:
a first resistor connected between the first NMOS transistor and the first node;
a second resistor connected between the second NMOS transistor and the second node; and
a third resistor connected between the second node and the first PMOS transistor,
wherein, when the first transmission method is supported, the first and second resistors increase linearity of an impedance, and
when the second transmission method is supported, the first and third resistors increase linearity of impedance.

12. The driver of claim 1, wherein the first transmission method comprises a low power dual data rate (LPDDR) 4 transmission method, and the second transmission method comprises an LPDDR3 transmission method.

13. A memory controller comprising:
a driver configured to transmit data to a semiconductor memory device supporting a first or second transmission method; and
a data bus connected to the driver, and configured to transmit the data to and receive the data from the semiconductor memory device,
wherein the driver comprises:
a first NMOS transistor connected between a ground voltage source and a first node, and controlled by a first signal;
a second NMOS transistor connected between the first node and a second node, and controlled by a second signal;

a first PMOS transistor connected between the second node and a power supply voltage source, and controlled by a third signal; and a pad connected to the first node, wherein, when the first transmission method is supported and the first PMOS transistor is activated, a power supply voltage is applied to the pad via the second node, and when the second transmission method is supported, the pad is connected to the second node.

14. The memory controller of claim 13, further comprising:

a first resistor connected between the first NMOS transistor and the first node;

a second resistor connected between the second NMOS transistor and the second node; and a third resistor connected between the second node and the first PMOS transistor, wherein, when the first transmission method is supported, the first and second resistors increase linearity of an impedance, and when the second transmission method is supported, the first and third resistors increase linearity of impedance.

15. The memory controller of claim 13, further comprising a second PMOS transistor connected between the second node and the pad, and controlled by a fourth signal, the second and third signals have opposite phases, or the power supply voltage is applied to the second signal, and the first or second transmission method is supported according to the fourth signal.

16. An electronic apparatus, comprising:

a line driver including circuitry for low power double data rate 3 (LPDDR3) transmission;

circuitry for low power double data rate 4 (LPDDR4) transmission; and selection circuitry for selecting between LPDDR3 and LPDDR4 transmission, wherein the selection circuitry includes an antifuse.

17. A memory controller including the electronic apparatus of claim 16.

18. A memory system, comprising:

the memory controller of claim 17; and a plurality of memory devices arranged to be controlled by the memory controller.

19. The electronic apparatus of claim 16 wherein the selection circuitry includes an optional final metallization trace.

* * * * *